United States Patent
Oh et al.

(10) Patent No.: US 11,804,276 B2
(45) Date of Patent: Oct. 31, 2023

(54) BUILT-IN-SELF-TEST LOGIC, MEMORY DEVICE WITH SAME, AND MEMORY MODULE TESTING METHOD

(71) Applicant: SAMSUNG ELECTRONICS CO., LTD., Suwon-si (KR)

(72) Inventors: Eunhye Oh, Suwon-si (KR); Jaehyeok Kim, Seoul (KR); Yong Ki Lee, Suwon-si (KR); Gapkyoung Kim, Suwon-si (KR); Taewook Park, Suwon-si (KR)

(73) Assignee: Samsung Electronics Co., Ltd.

( * ) Notice: Subject to any disclaimer, the term of this patent is extended or adjusted under 35 U.S.C. 154(b) by 127 days.

(21) Appl. No.: 17/467,861

(22) Filed: Sep. 7, 2021

(65) Prior Publication Data

US 2022/0293205 A1    Sep. 15, 2022

(30) Foreign Application Priority Data

Mar. 11, 2021    (KR) .................. 10-2021-0032027

(51) Int. Cl.
*G11C 29/42*    (2006.01)
*G11C 29/44*    (2006.01)
*G11C 29/10*    (2006.01)
*G11C 29/36*    (2006.01)

(52) U.S. Cl.
CPC .............. *G11C 29/42* (2013.01); *G11C 29/10* (2013.01); *G11C 29/36* (2013.01); *G11C 29/4401* (2013.01)

(58) Field of Classification Search
CPC ......... G11C 29/42; G11C 29/10; G11C 29/36; G11C 29/4401
See application file for complete search history.

(56) References Cited

U.S. PATENT DOCUMENTS

| | | | |
|---|---|---|---|
| 5,195,694 A | 3/1993 | Watanabe et al. | |
| 6,799,287 B1 | 9/2004 | Sharma et al. | |
| 7,266,735 B2 | 9/2007 | Hirabayashi | |
| 7,398,439 B2* | 7/2008 | Kushida | G11C 29/42 |
| | | | 714/764 |
| 8,386,867 B2 | 2/2013 | Sul et al. | |
| 2008/0016421 A1* | 1/2008 | McDevitt | G01R 31/31724 |
| | | | 714/733 |
| 2009/0319840 A1* | 12/2009 | Hara | G06F 11/1068 |
| | | | 714/E11.169 |
| 2011/0225475 A1* | 9/2011 | Kumar | G06F 11/1008 |
| | | | 714/763 |

FOREIGN PATENT DOCUMENTS

| | | |
|---|---|---|
| JP | 2512931 Y2 | 10/1996 |
| JP | 2002340994 A | 11/2002 |

\* cited by examiner

*Primary Examiner* — Tuan T Nguyen
(74) *Attorney, Agent, or Firm* — Fish & Richardson P.C.

(57) ABSTRACT

A memory device includes a memory module and a BIST logic circuit. The BIST logic circuit includes; a pattern generator configured to generate first main data including a first portion, an error correction code (ECC) encoder configured to generate first parity data based on the first main data, and a parity control circuit configured to generate mask data based on the first parity data and the first main data, and generate first substituted parity data based on the mask data and the first parity data, wherein a pattern of the first substituted parity data is the same as a pattern of the first portion of the first main data.

20 Claims, 24 Drawing Sheets

FIG. 10C

| | bin | | | | | | | | | | | | | | | hex |
|---|---|---|---|---|---|---|---|---|---|---|---|---|---|---|---|---|
| | 13 | 12 | 11 | 10 | 9 | 8 | 7 | 6 | 5 | 4 | 3 | 2 | 1 | 0 | | |
| OPD1,2 | 0 | 0 | 0 | 1 | 0 | 1 | 0 | 1 | 1 | 0 | 1 | 0 | 0 | 0 | | 0568 |
| M | 1 | 1 | 1 | 0 | 1 | 0 | 1 | 0 | 0 | 1 | 0 | 1 | 1 | 1 | | 3A97 |
| SPD1,2 | 1 | 1 | 1 | 1 | 1 | 1 | 1 | 1 | 1 | 1 | 1 | 1 | 1 | 1 | | 3FFF |

BUILT-IN-SELF-TEST LOGIC, MEMORY DEVICE WITH SAME, AND MEMORY MODULE TESTING METHOD

CROSS-REFERENCE TO RELATED APPLICATION

This application claims priority under 35 U.S.C. § 119 to Korean Patent Application No. 10-2021-0032027 filed on Mar. 11, 2021 in the Korean Intellectual Property Office, the subject matter of which is hereby incorporated by reference.

BACKGROUND

Embodiments of the inventive concept relate generally to semiconductor memories, and more particularly to built-in-self-test (BIST) logic, memory devices including BIST logic, and testing methods for memory modules including such memory devices.

Semiconductor memory devices may be classified as volatile or nonvolatile according to their operative nature. Volatile memory devices (e.g., static random access memory (SRAM) and dynamic random access memory (DRAM)) lose stored data in the absence of applied power, whereas nonvolatile memory devices (e.g., flash memory, phase-change RAM (PRAM), magnetic RAM (MRAM), resistive RAM (RRAM), and ferroelectric RAM (FRAM)) retain stored data when power is interrupted.

Memory modules may fail due to a number of factors. However, many failures (or potential failure mechanisms) potentially arising during the fabrication of a memory module and/or memory devices associated with the memory module may be detected during testing of the memory module.

SUMMARY

Embodiments of the inventive concept provide BIST logic exhibiting improved performance efficiency, memory devices including such BIST logic, and testing methods for memory modules and/or memory devices.

According to one embodiment, a memory device includes a memory module, and a built-in self-test (BIST) logic circuit configured to perform testing on memory cells of the memory module. The BIST logic circuit includes; a pattern generator configured to generate first main data including a first portion, an error correction code (ECC) encoder configured to generate first parity data based on the first main data, and a parity control circuit configured to generate mask data based on the first parity data and the first main data, and generate first substituted parity data based on the mask data and the first parity data, wherein a pattern of the first substituted parity data is the same as a pattern of the first portion of the first main data.

According to another embodiment, a BIST logic circuit configured to perform a testing on a memory module includes; a pattern generator configured to generate first main data, an error correction code (ECC) encoder configured to generate first parity data for the first main data, an ECC decoder, and a parity control circuit configured during a write operation to receive the first main data and the first party data and generate write data, and further configured during a read operation to receive read data including second main data and second substituted parity data, wherein the parity control circuit includes a mask generating module configured to generate mask data based on the first main data and the first parity data, a parity substituting module configured to generate first substituted parity data based on the mask data and the first parity data, and a parity restoring module configured to generate second parity data based on the mask data and the second substituted parity data, the parity control circuit is further configured to send the write data including the first substituted parity data and the first main data to the memory module and receive the read data from the memory module, and the ECC decoder is configured to correct an error in the second main data based on the second parity data and the second main data.

According to another embodiment, a method of testing a memory module including a plurality of memory cells includes; generating first main data to be written in the plurality of memory cells, generating first parity data for the first main data, setting mask data based on the first parity data and the first main data, performing a parity substitution operation generating first substituted parity data based on the first parity data and the mask data, writing write data including the first main data and the first substituted parity data in the plurality of memory cells, reading stored write data from the plurality of memory cells to generate read data including second main data and second substituted parity data, performing a parity restoration operation generating second parity data from the second substituted parity data using the mask data, and correcting an error in the second main data using the second parity data, wherein a pattern of the first substituted parity data is the same as a pattern of a first portion of the first main data.

BRIEF DESCRIPTION OF THE DRAWINGS

The above and other objects and features of the inventive concept will become more apparent upon consideration of the following detail description together with the accompanying drawings, in which:

FIGS. 10A, 10B and 10C are related block diagrams further illustrating in one example operation of the parity control circuit 111 of FIG. 1;

DETAILED DESCRIPTION

Throughout the written description and drawings, like reference numbers and labels denote like elements, components, method steps and/or features.

Figure 1:
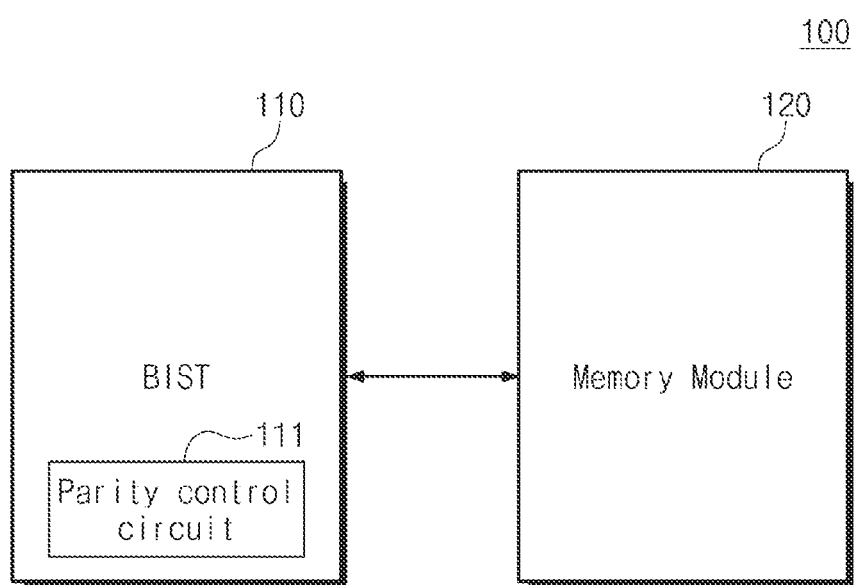
FIG. 1 is a general block diagram illustrating a memory device according to embodiments of the inventive concept.

FIG. 1 is a block diagram illustrating a memory device 100 according to embodiments of the inventive concept.

Referring to FIG. 1, the memory device 100 may generally include a built-in-self-test (BIST) logic circuit 110 and a memory module 120. The BIST logic circuit 110 may be used to perform a self-test operation on the memory module 120. The BIST logic circuit 110 may also be used to detect failure(s) of the memory module 120 due to processing in the manufacture (or fabrication) of the memory module 120.

That is, the BIST logic circuit 110 may perform a test operation capable of detecting failure(s) of the memory module 120. For example, the BIST logic circuit 110 may perform a test operation determining whether the memory module 120 normally performs various operations (e.g., a write operation and a read operation). In this context the term "normally" denotes a performance (or performing) outcome (or result) meeting defined specification(s).

Hereafter, for consistency and clarity of description, it is assumed that the BIST logic circuit 110 tests the performance of a write operation and a read operation of the memory module 120. It is further assumed that the memory module 120 includes at least one magnetic random access memory (MRAM) device. However, those skilled in the art will recognize that scope of the inventive concept is not limited to only this example, and the BIST logic circuit 110 may be variously configured to detect failures occurring in the memory module including a Static RAM (SRAM), a dynamic RAM (DRAM), flash memory, a phase-change RAM (PRAM), a resistive RAM (RRAM), and/or a ferroelectric RAM (FRAM).

The BIST logic circuit 110 may be configured to control the memory module 120 during the testing of the write operation and/or the read operation. For example, the BIST logic circuit 110 may generate a test pattern to-be-written in the memory module 120, and may then write the generated test pattern. The BIST logic circuit 110 may determine fail bits occurring in the memory module 120 by reading the test pattern from the memory module 120, and then comparing the read results (e.g., a read pattern) with the test pattern. In this manner, the BIST logic circuit 110 may evaluate the reliability of the memory module 120 in relation to the write operation and/or the read operation.

In some embodiments, the test pattern may be a series of bit streams necessary to determine whether the write operation and the read operation performed on a plurality of memory cells included in the memory module 120 fails. For example, the test pattern may include main data and parity data associated with the main data.

In some embodiments, the BIST logic circuit 110 may include a parity control circuit 111. The parity control circuit 111 may also be used to generate "substituted parity data" by converting the parity data. For example, the parity control circuit 111 may selectively replace a bit "0" in the parity data with a bit "1" to generate the substituted parity data.

By generating and using the substituted parity data during memory module testing in place of the parity data, embodiments of the inventive concept do not necessarily require multiple iterations of testing for the write operation and the read operation. And by eliminating these conventionally-required iterations, the speed of the overall testing method may be notably improved without sacrificing reliability of testing for the memory module 120. Exemplary operations of the BIST logic circuit 110 and the parity control circuit 111 according to embodiments of the inventive concept will be described hereafter in some additional detail.

Figure 2:
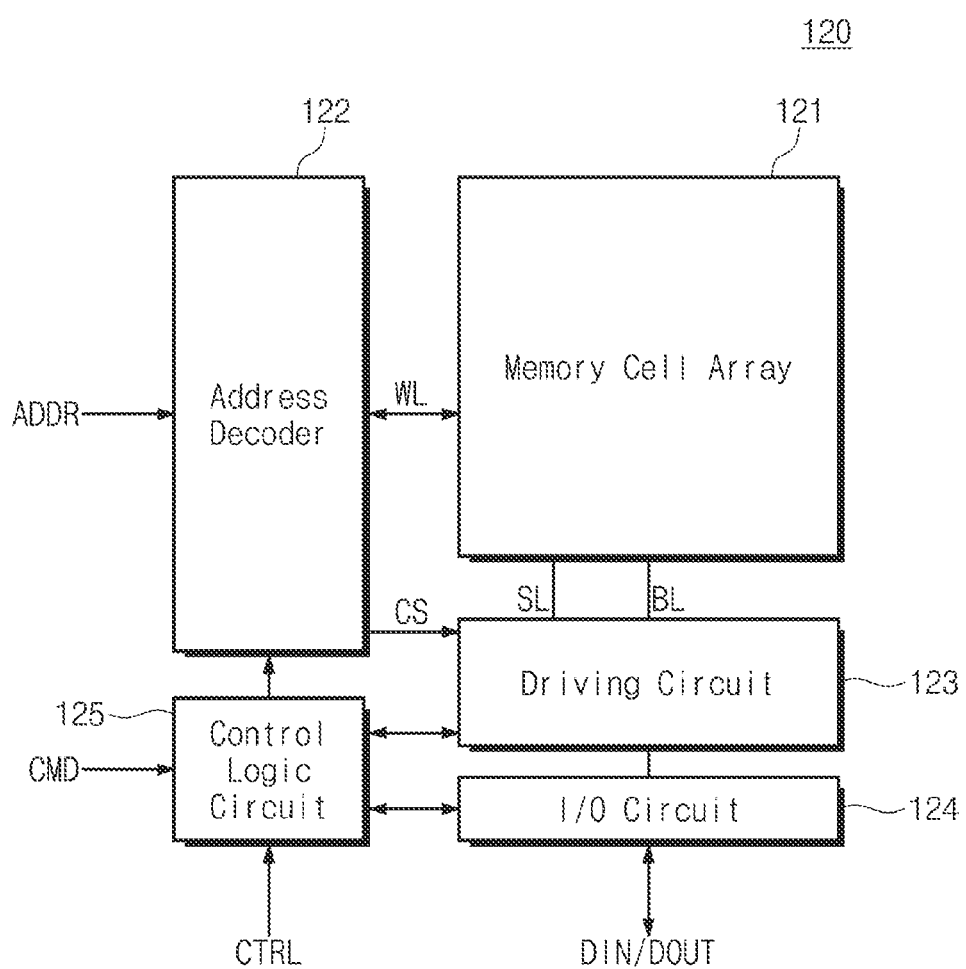
FIG. 2 is a block diagram further illustrating the memory module 120 of FIG. 1.

FIG. 2 is a block diagram further illustrating in one example the memory module 120 of FIG. 1. Referring to FIG. 2, the memory module 120 may include a memory cell array 121, an address decoder 122, a write driver/sense amplifier 123 (hereinafter, the "driving circuit"), an input/output (I/O) circuit 124, and a control logic circuit 125.

The memory cell array 121 may include a plurality of memory cells MC, wherein each of the memory cells is selectively connected among respective arrangements of word lines WL, bit lines BL and source lines SL. In some embodiments, each of the memory cells MC is a MRAM cell, but the scope of the inventive concept is not limited thereto.

The address decoder 122 may be connected with the memory cell array 121 through the word lines WL. The address decoder 122 may receive an address ADDR from the BIST logic circuit 110 (or an external device such as a memory controller, not illustrated) and may decode the received address ADDR. The address decoder 122 may independently control voltages of the word lines WL based on a decoding result. The address decoder 122 may output a column selection signal CS based on the decoding result.

The driving circuit 123 may be connected with the memory cell array 121 through the source lines SL and the bit lines BL. The driving circuit 123 may select the source lines SL and the bit lines BL in response to the column selection signal CS. Alternately, the driving circuit 123 may read data stored in the plurality of memory cells MC of the memory cell array 121 by sensing voltages of the source lines SL or the bit lines BL.

The I/O circuit 124 may receive input data DIN from the BIST logic circuit 110 (e.g., as implemented within an external device such as a memory controller) and may provide the received input data DIN to the driving circuit 123. In some embodiments, the driving circuit 123 may write the input data DIN in the plurality of memory cells MC of the memory cell array 121 by controlling voltages of the source lines SL and the bit lines BL based on the input data DIN. The I/O circuit 124 may receive output data DOUT from the driving circuit 123 and may output the received output data DOUT to the BIST logic circuit 110 (e.g., the memory controller).

In some embodiments, the BIST logic circuit 110 may perform a test operation using certain input data DIN having a prescribed test pattern (hereafter "test data"). In this manner, test data having the test pattern may be written in the memory cells MC of the memory cell array 121. Thereafter, the stored test data may be read from the memory cells MC as output data DOUT (hereafter, "read test data"). If the components and memory cells of the memory module 120 are operating normally, the read test data will have the same test pattern as the stored test data.

The control logic circuit 125 may receive a command CMD or control signal(s) CTRL from the BIST logic circuit 110 (e.g., the memory controller). Operation of the memory module 120 may be determined by the command CMD and/or the control signal(s) CTRL. For example, the control logic circuit 125 may control the driving circuit 123 such that the driving circuit 123 operates as a write driver during the write operation, and as a sense amplifier during the read operation.

Figure 3A:
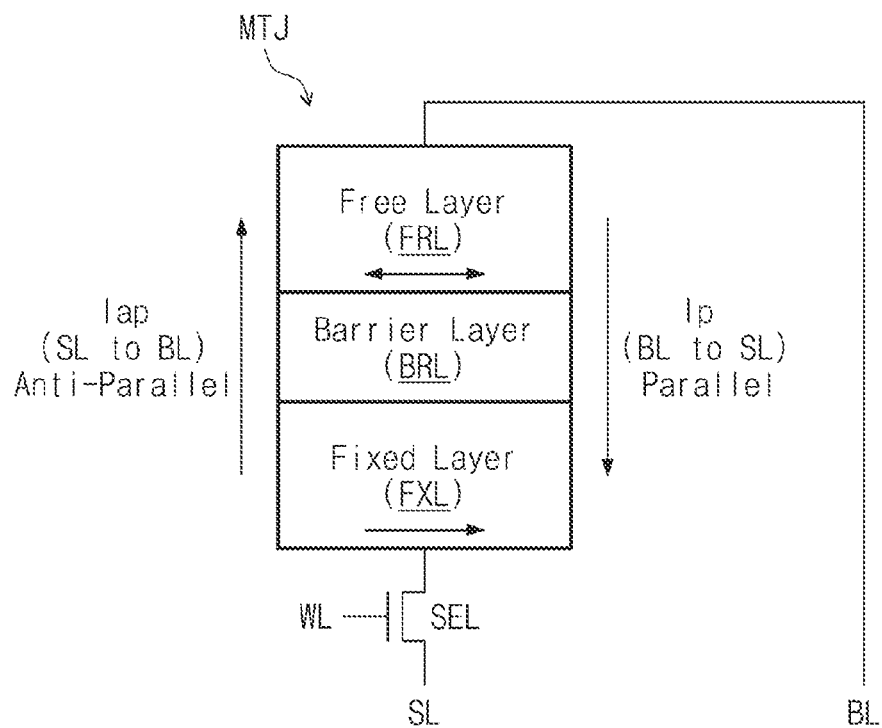
FIGS. 3A and 3B are conceptual diagrams illustrating an exemplary memory cell that may be included in the memory cell array 121 of FIG. 2.
Figure 3B:
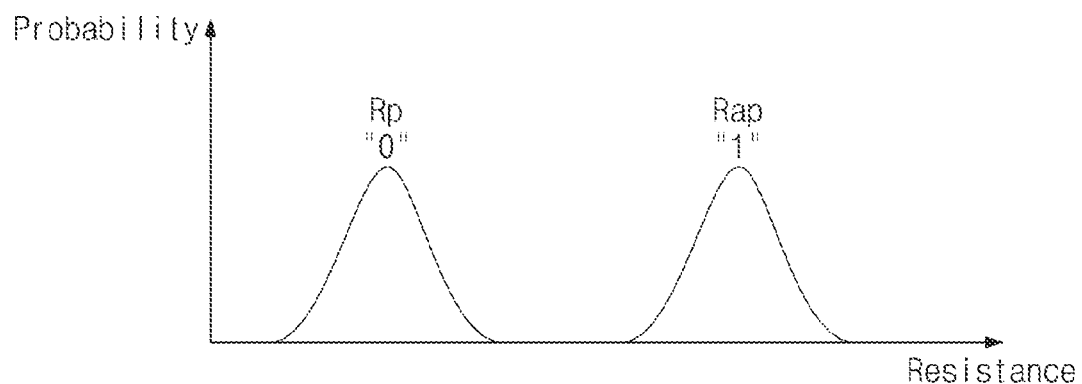

FIGS. 3A and 3B are respective conceptual diagrams further illustrating one example of a memory cell type that may be included in the memory cell array 121 of FIG. 2. Here, a write operation performed by the memory module 120 will be described as a working example. In this regard, FIG. 3A illustrates an exemplary structure of a MRAM memory cell MC, and FIG. 3B is a graph illustrating a relationship between 'Resistance' of a variable resistance element (e.g., a magnetic tunnel junction of MTJ) of the MRAM and the 'Probability' of a written binary (1 or 0) data state.

Referring collectively to FIGS. 2, 3A and 3B, the memory cell MC is assumed to include the variable resistance element MTJ and a selection transistor SEL. The variable resistance element MTJ may be connected between a bit line BL and the selection transistor SEL. The selection transistor SEL may be connected between the variable resistance element MTJ and a source line SL and may operate in response to a voltage of a word line WL.

In some embodiments, the memory module 120 may write data in the memory cell MC by adjusting a resistance value of the memory cell MC. For example, as illustrated in FIG. 3A, the variable resistance element MTJ may include a free layer FRL, a barrier layer BRL, and a fixed layer FXL. The barrier layer BRL may be interposed between the free layer FRL and the fixed layer FXL, the free layer FRL may be connected with the bit line BL, and the fixed layer FXL may be connected with the selection transistor SEL. A magnetization direction of the fixed layer FXL may be fixed to a specific direction, and a magnetization direction of the free layer FRL may be changed according to a specific condition (e.g., a direction of a write current). In some embodiments, the variable resistance element MTJ may further include an anti-ferromagnetic layer for fixing the magnetization direction of the fixed layer FXL.

In some embodiments, the free layer FRL may include a material that has a variable magnetization direction. The magnetization direction of the free layer FRL may be changed by an electrical or magnetic factor provided from the outside or the inside of the memory cell MC. The free layer FRL may include one or more ferromagnetic material(s) containing, for example, cobalt (Co), iron (Fe), and/or nickel (Ni). Thus, the free layer FRL may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, Y3Fe5O12, etc.

In some embodiments, the barrier layer BRL may have a thickness less than a spin diffusion distance. The barrier layer BRL may include a non-magnetic material. For example, the barrier layer BRL may include at least one of magnesium (Mg), titanium (Ti), aluminum (Al), an oxide of magnesium-zinc (Mg—Zn), an oxide of magnesium-boron (MgB), a nitride of titanium (Ti), a nitride of vanadium (V), etc.

In some embodiments, the fixed layer FXL may have a magnetization direction fixed by the anti-ferromagnetic layer. The fixed layer FXL may include a ferromagnetic material. For example, the fixed layer FXL may include at least one of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, Y3Fe5O12, etc.

In some embodiments, the anti-ferromagnetic layer may include an anti-ferromagnetic material, such as PtMn, IrMn, MnO, MnS, MnTe, MnF2, FeCl2, FeO, CoCl2, CoO, NiCl2, NiO, Cr, etc.

In regard to the foregoing alternatives, those skilled in the art will appreciate that the structure and constituent material(s) of the variable resistance element MTJ may vary by design.

As shown in FIG. 3A, the magnetization direction of the free layer FRL may be changed according to a direction of a current Iap or Ip flowing through the variable resistance element MTJ. The current Iap or Ip may be generated by controlling voltages of the bit line BL and the source line SL when the selection transistor SEL is turned on by a voltage of the word line WL.

The anti-parallel current Iap illustrated in FIG. 3A may flow toward the bit line BL from the source line SL. When the anti-parallel current Iap flows through the variable resistance element MTJ, the magnetization direction of the free layer FRL may be opposite to the magnetization direction of the fixed layer FXL, which is called an "anti-parallel state". Alternately, the parallel current Ip shown in FIG. 3A may flow from the bit line BL to the source line SL. When the parallel current Ip flows through the variable resistance element MTJ, the magnetization direction of the free layer FRL may be identical to the magnetization direction of the fixed layer FXL, which is called a "parallel state".

As shown in FIG. 3B, in the case when the variable resistance element MTJ is in the anti-parallel state, the variable resistance element MTJ may have an anti-parallel resistance value Rap. However, when the variable resistance element MTJ is in the parallel state, the variable resistance element MTJ may have a parallel resistance value Rp. Thus, data may be stored in the memory cell MC in relation to a resistance value of the variable resistance element MTJ, and the data (e.g., bit "1" or bit "0") stored in the memory cell MC may be read by reading (or sensing) the resistance value of the variable resistance element MTJ.

In some embodiments, test data may not be normally written in the memory cell MC due to Process, Voltage and/or Temperature (PVT) variations during the fabrication of certain memory cells MC among the plurality of memory cells. Such PVT variations may affect the variable resistance element MTJ, or some other structure of the memory cells MC. For example, when bit "1" is written in the memory cell MC, a control may be made such that the anti-parallel current Iap flows through the variable resistance element MTJ of the memory cell MC. However, due to various factors (e.g., PVT variations) associated with the memory cell MC, the anti-parallel current Iap of sufficient magnitude may not flow through the variable resistance element MTJ, or even though the anti-parallel current Iap of sufficient magnitude flows through the variable resistance element MTJ, the resistance of the variable resistance element MTJ may not be set to the anti-parallel resistance Rap. In such cases, data may be read from the memory cell MC as bit "0". Likewise, when bit "0" is written in the memory cell MC, the variable resistance element MTJ may fail to have the parallel resistance Rp due to various factors of the memory cell MC. That is, a write failure for the memory cell MC may stochastically occur.

The BIST logic circuit 110 of FIG. 1 may be used to selectively (e.g., iteratively or sequentially) perform a number of test operations capable of detecting failed memory cells among the plurality of memory cells MC. For example, each test operation may include writing a test data having a test pattern to a selected number of memory cells among the plurality of memory cells MC, and then reading the stored test data to determine whether the stored and retrieved test data has the test pattern. Examples of the operation of the BIST logic circuit 110 will be described hereafter in some additional detail.

Figure 4A:
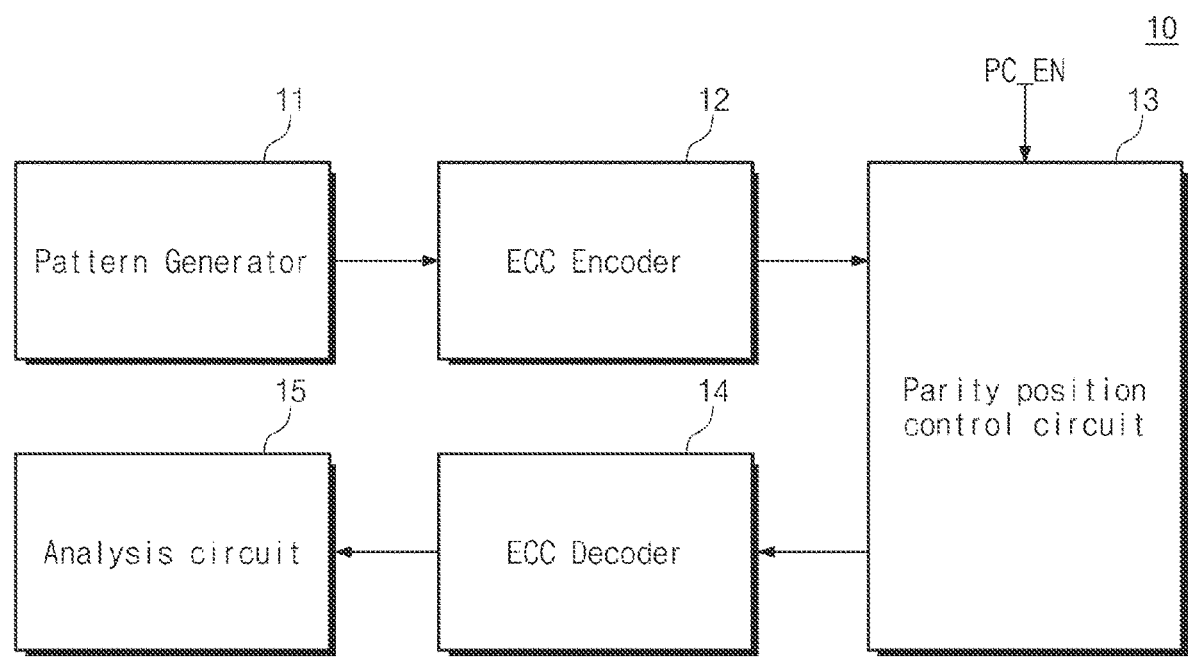
FIG. 4A is a block diagram illustrating a comparative BIST logic circuit 10.
Figure 4B:
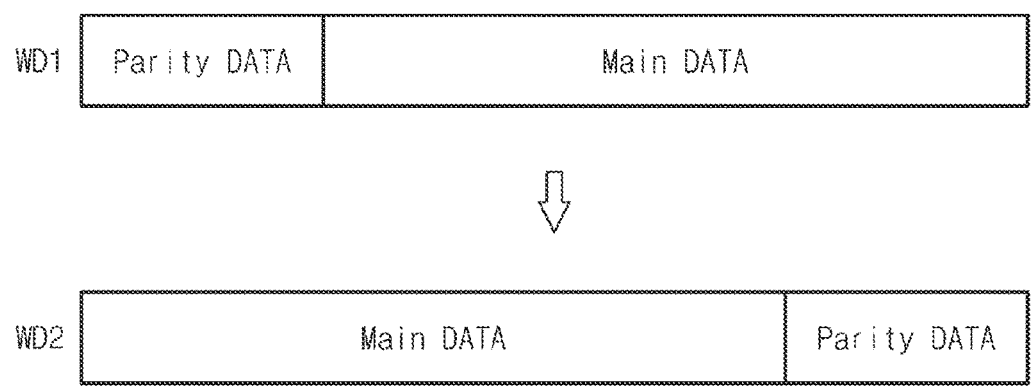
FIGS. 4B, 4C and 4D are related conceptual diagrams illustrating an exemplary test operation performed by the comparative BIST logic circuit 10.
Figure 4C:
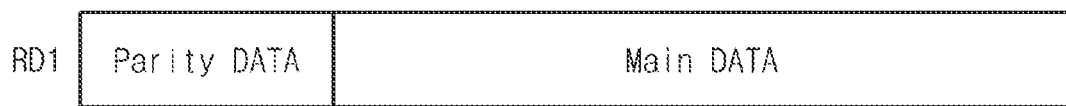
Figure 4C:
Figure 4C:
Figure 4D:
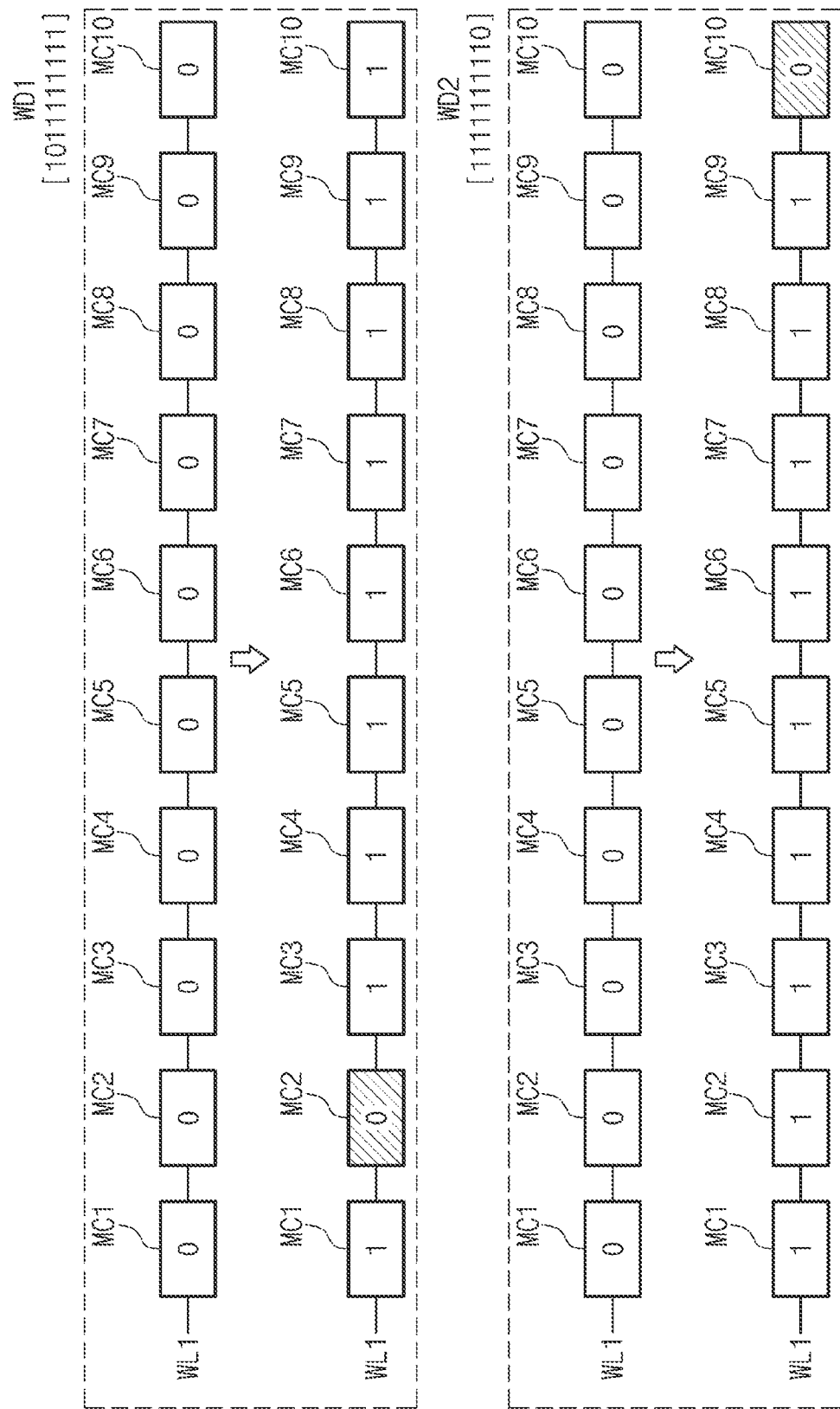

FIG. 4A is a block diagram illustrating a comparative BIST logic circuit 10, and FIGS. 4B, 4C and 4D are related conceptual diagrams illustrating an exemplary test operation performed by the comparative BIST logic circuit 10.

Referring to FIGS. 4A, 4B, 4C and 4D, the BIST logic circuit 10 may include a pattern generator 11, an error correction code (ECC) encoder 12, a parity position control circuit 13, an ECC decoder 14, and an analysis circuit 15.

The pattern generator 11 may generate main data to be used during the write/read testing of a memory module. Here, for example, a value of the main data may be "64'hFFFF_FFFF_FFFF_FFFF", or "64'h0000_0000_0000_0000", or any other particular value compatible with the testing design.

The ECC encoder 12 may receive the main data from the pattern generator 11 and generate corresponding parity data using a defined error detection correction code (ECC). For example, the ECC encoder 12 may receive main data having a value of "64'hFFFF_FFFF_FFFF_FFFF" and may generate parity data having a value of "14h'0568".

The ECC used by the ECC encoder 12 may include one or more of a low-density parity check (LDPC) code, a Bose, Chaudhuri, Hocquenghem (BCH) code, a turbo code, a Reed-Solomon code, a convolution code, a recursive systematic code (RSC), and a coded modulation such as a trellis-coded modulation (TCM), a block coded modulation (BCM), etc.

Thus, the ECC encoder 12 may generate parity data to be written in a memory module 120 based on the main data, and may provide the parity data together with the main data to the parity position control circuit 13.

The parity position control circuit 13 may receive the main data, the parity data and a position control enable signal PC_EN. Thereafter, the parity position control circuit 13 may adjust a position of the parity data in response to the position control enable signal PC_EN.

For example, when the position control enable signal PC_EN has a first logical value indicating a disabled state, the parity position control circuit 13 may generate test data without changing the position of the parity data with respect to the main data. However, when the position control enable signal PC_EN has a second logical value indicating an enabled state, the parity position control circuit 13 may generate test data in which the position of the parity data relative to the main data has been changed.

Referring to FIG. 4B, the parity position control circuit 13 may receive first write data WD1. When the position control enable signal PC_EN has the first logical value, the parity position control circuit 13 may provide the first write data WD1 (as test data) to the memory module without modification. However, when the position control enable signal PC_EN has the second logical value, the parity position control circuit 13 may change or convert the first write data WD1 into second write data WD2. That is, the parity position control circuit 13 may convert the first write data WD1 in which the parity data are placed before the main data into the second write data WD2 in which the parity data are placed behind the main data. The parity position control circuit 13 may then provide the second write data WD2 (as test data) to the memory module.

That is, assuming the main data is M-bit data ('m' being a positive number), the parity data is K-bit data ('K' being a positive number), and the write data is N-bit data ('N'= (M+K)). Thus, the parity data of the first write data WD1 may include M-th to (N−1)-th bits of the first write data WD1, and the main data of the first write data WD1 may include 0-th to (M−1)-th bits of the first write data WD1. The parity data of the second write data WD2 may include 0-th to (K−1)-th bits of the second write data WD2, and the main data of the second write data WD2 may include K-th to (N−1)-th bits of the second write data WD2.

During a subsequent read operation, the parity position control circuit 13 may receive read data from the memory module. When the position control enable signal PC_EN has the first logical value, the parity position control circuit 13 may provide the read data to the ECC decoder 14 without modifying the position of the parity data. However, when the position control enable signal PC_EN has the second logical value, the parity position control circuit 13 must change a position of the parity data in the read data before providing the read data to the ECC decoder 14.

Referring to FIG. 4C, when the position control enable signal PC_EN has the first logical value, the parity position control circuit 13 may receive first read data RD1 and may provide the first read data RD1 to the ECC decoder 14. However, when the position control enable signal PC_EN has the second logical value, the parity position control circuit 13 may receive second read data RD2, convert the second read data RD2 into the first read data RD1, and provide the first read data RD1 to the ECC decoder 14. That is, the parity position control circuit 13 may convert the second read data RD2—in which the parity data are placed behind the main data—into the first read data RD1—in which the parity data are placed before the main data.

Referring to FIG. 4D, a write failure may occur in relation to testing of the memory module. Here, the main data are [11111111], the parity data are [10], and write/read testing is performed on ten (10) memory cells (e.g., MC1 to MC10, inclusive) connected to a first word line WL1. Further, it is assumed that the BIST logic circuit 10 tests whether the variable resistance element MTJ of the memory cells MC normally switches from the parallel state to the anti-parallel state (i.e., whether bit "1" is normally written in each memory cell MC).

As shown in FIG. 4D, during a first write/read test, the BIST logic circuit 10 writes first write data WD1 of [1011111111] in the memory cells MC1 to MC10. However, during this first write/read test, bit "1" may not be properly written in memory cell MC2 during the write/read test. That is, anti-parallel current Iap is successfully provide to each of the memory cells MC1 and MC3 to MC10, as previously described in relation to FIGS. 2, 3A and 3B.

Unfortunately, because the parity data are [10], in the case of the second memory cell MC2, it is impossible to accurately determine whether or not the bit "1" was normally written. Accordingly, the BIST logic circuit 10 must perform a second write/read test using second write data WD2 following the first write/read test in order to accurately determine the reliability of memory cell MC2.

Accordingly, during the second test, the BIST logic circuit 10 may write second write data WD2 [1111111110] in the memory cells MC1 to MC10 connected with the first word line WL1 of the memory module 120. In this case, bit "1" is written in the memory cells MC1 to MC9 during the write operation (e.g., providing the anti-parallel current Iap to each of the memory cells MC1 to MC9). However, because the parity data are [10], in the case of the tenth memory cell MC10, it is impossible to determine whether bit "1" has been normally written.

From these examples, it may be understood that even though the main data may be designed to include a sequence of all 1's, the corresponding parity data may include one or more bit "0". Therefore, in order to accurately test whether bit "1" has been normally written in all memory cells undergoing test, the comparative BIST logic circuit 10 must change a position of the parity data in relation to the write data at least once, thereby resulting in a minimum of at least two (2) test operations for each group of memory cells being tested.

The ECC decoder 14 may receive read data from the parity position control circuit 13. The ECC decoder 14 may detect and correct an error of the main data in the read data by decoding the read data using ECC. That is, the ECC decoder 14 may generate corrected main data.

The ECC decoder 14 may provide the corrected main data along with ECC status information to the analysis circuit 15. The ECC status information may include information related to a number of corrected bit(s), position(s) of corrected bit(s), etc. Here, information indicating the number of corrected bit(s) may indicate information about how many error bits occurred in the main data, and whether the error bits were successfully corrected. For example, in the case where the ECC decoder 14 is capable of correcting a 3-bit error, the information about the corrected bit number may be implemented using 2 bits. When the number of bits corrected in the main data is "0", a value of the information about the corrected bit number may "00"; when the number of bits corrected in the main data is "1", a value of the information about the corrected bit number may "01"; when the number of bits corrected in the main data is "2", a value of the information about the corrected bit number may "10"; and, when the number of bits corrected in the main data is "3", a value of the information about the corrected bit number may "11".

Information about a corrected bit position may indicate a position of a bit corrected in the main data. A size of the corrected bit position information may correspond to the number of bits of the main data. For example, when the main data are an 8-bit stream and second to fourth bits of the main data are corrected, the corrected bit position information may be 8-bit information, and a value of the corrected bit position information may be [00111000].

The analysis circuit 15 may receive the ECC status information and the corrected main data from the ECC decoder 14. The analysis circuit 15 may generate a test result, based on the ECC status information and the corrected main data. The test result may include the number of fail bits, a number for each fail type, and the ECC status information. The number of fail bits may indicate the number of errors occurring in the whole memory module.

Here, a fail type may be classified as a 1-bit fail, a 2-bit fail, or a 3-bit fail in units of main data. A main data unit may indicate a size of main data being a reference for generating parity data. For example, in the case of generating 14-bit parity data from 64-bit main data, the main data unit may be 64 bits. Alternately, in the case of generating 24-bit parity data from 128-bit main data, the main data unit may be 128 bits. The number for each fail type may include information about a 1-bit fail number, information about a 2-bit fail number, or information about a 3-bit fail number in units of main data with respect to the whole memory module.

During the test, when bit "1" is written and bit "0" is read, the BIST logic circuit 110 may detect a memory failure. However, when bit "0" is written and bit "0" is read, the BIST logic circuit 10 may not determine whether a failure is present in the corresponding memory cell.

For example, assuming that the value of main data is "64'hFFFF_FFFF_FFFF_FFFF" and a value of parity data is "14h' 0568". Write data may include the main data and the parity data. The main data may be 64-bit data, the parity data may be 14-bit data, and the write data may be 78-bit data. In this case, because "14h'0568" is converted into "00010101101000" being a binary number, the number of 0s of the parity data may be 9.

As described above, in the case of writing "0", because it is impossible to determine whether a failure is present in a memory cell, a position of parity data may be changed, and testing must be repetitively performed. That is, the BIST logic circuit 10 may write "1" in all memory cells of the memory module by performing the first test based on the first write data WD1 and performing the second test based on the second write data WD2. As such, a test for determining whether a failure occurs in a memory cell may be performed on all the memory cells of the memory module. However, such iterative testing may greatly increase the time required to perform overall testing of a memory module.

Figure 5:
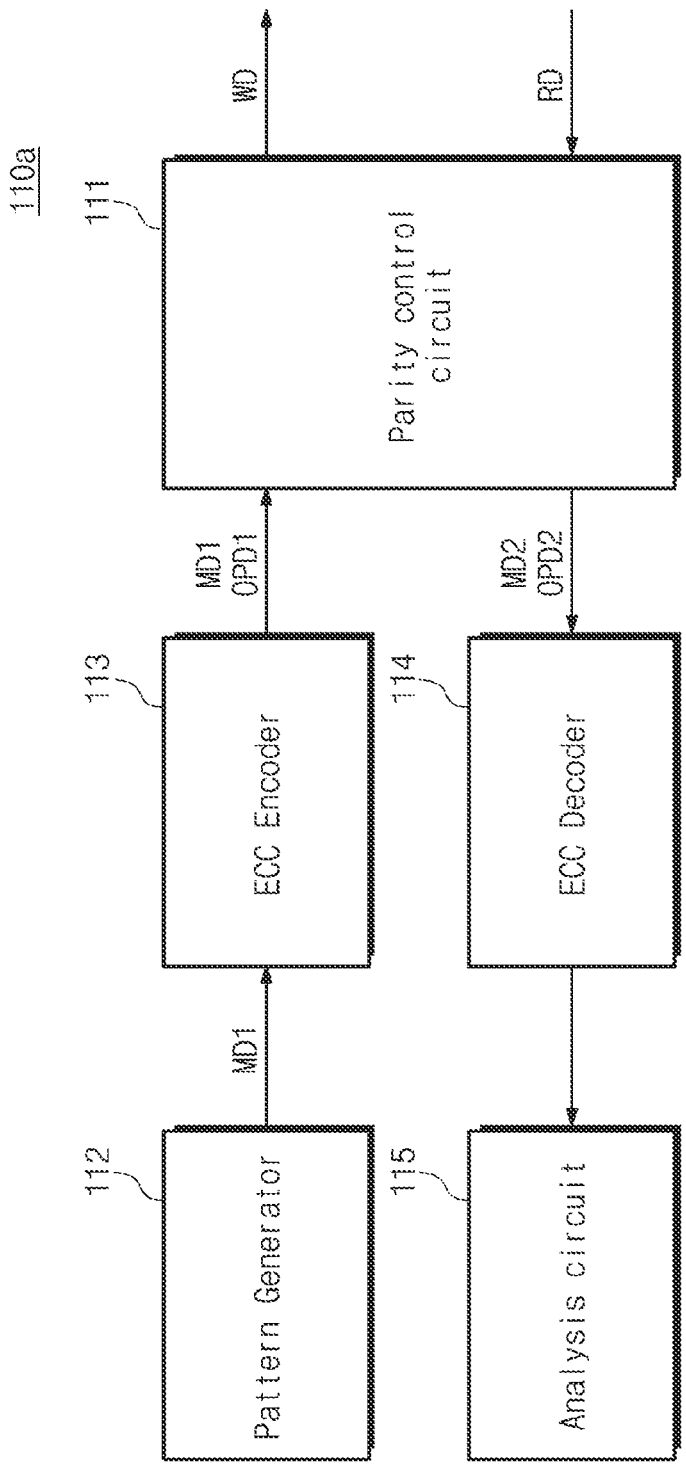
FIG. 5 is a block diagram further illustrating in another example 110a the BIST logic circuit 110 of FIG. 1 according to embodiments of the inventive concept.

FIG. 5 is a block diagram further illustrating in one example (110a) the BIST logic circuit 110 of FIG. 1. Referring to FIGS. 1 and 5, the BIST logic circuit 110a may include a parity control circuit 111, a pattern generator 112, an ECC encoder 113, an ECC decoder 114 and an analysis circuit 115.

In some embodiments, the pattern generator 112 may generate main data MD1 to be used during testing. The pattern generator 112 may output the main data MD1 to the ECC encoder 113. Here, the value (or test pattern) of the main data MD1 may be "64'hFFFF_FFFF_FFFF_FFFF", "64'h0000_0000_0000_0000", or any other value consistent with testing objectives.

In some embodiments, the pattern generator 112 may generate main data having the same value with respect to an entire range of memory module addresses. Alternately, the pattern generator 112 may generate main data having a first value for respective odd-numbered addresses, and having a second value for respective even-numbered addresses.

The pattern generator 112 may receive a test enable signal from an external device (not illustrated). For example, the test enable signal may be a signal starting a test operation in which a failure of the memory module is detected. The pattern generator 112 may start a reliability test of the memory module in response to the test enable signal.

The ECC encoder 113 may receive the main data MD1 generated from the pattern generator 112. The ECC encoder 113 may generate original parity data (OPD1) from the main data MD1 using defined ECC. The ECC encoder 113 may provide the original parity data OPD1 and the main data MD1 to the parity control circuit 111.

In some embodiments, the ECC may include one or more of a low density parity check (LDPC) code, a Bose, Chaudhuri, Hocquenghem (BCH) code, a turbo code, a Reed-Solomon code, a convolution code, a recursive systematic code (RSC), and a coded modulation such as a trellis-coded modulation (TCM) or a block coded modulation (BCM), etc.

However, consistent with embodiments of the inventive concept, the parity control circuit 111 of FIG. 5 may perform a parity substitution operation and a parity restoration operation. Here, the parity substitution operation may indicate a converting of the original parity data OPD1 into substituted parity data, and the parity restoration operation may indicate a converting (or reconverting) of the substituted parity data into original parity data OPD2.

Thus, the parity control circuit 111 may receive the original parity data OPD1 and the main data MD1 from the ECC encoder 113, and convert the original parity data OPD1 in order to generate the substituted parity data, based on the original parity data OPD1 and the main data MD1. Thereafter, the parity control circuit 111 may generate write data WD, based on the main data MD1 and the substituted parity data, and provide the write data WD to the memory module 120.

The parity control circuit 111 may perform the parity restoration operation. The parity control circuit 111 may receive read data RD from the memory module 120. For example, the parity control circuit 111 may send a read command directed to memory cells storing the write data WD, and receive the resulting read data RD read from the memory cells. The parity control circuit 111 may convert substituted parity data included in the read data RD into the original parity data OPD2. The parity control circuit 111 may then provide main data MD2 and the original parity data OPD2 to the ECC decoder 114.

In some embodiments, depending on a result of the parity substitution operation, a second number of 0s included in the substituted parity data may be less than a first number of 0s included in the original parity data OPD1. For example, the parity control circuit 111 may generate the substituted parity data such that the number of bits corresponding to bit "0" included in the original parity data OPD1 decreases. For example, assuming an example wherein a value of the original parity data OPD1 is "14h'0568", the parity control circuit 111 may generate substituted parity data having a value of "14h'3FFF".

The parity control circuit 111 may generate the original parity data OPD2, based on the substituted parity data included in the read data RD. That is, the parity control circuit 111 may perform the parity restoration operation. For example, when a value of the substituted parity data included in the read data RD is "14h'3FFF", the parity control circuit 111 may generate the original parity data OPD2 having a value of "14h'0568"—which is the same as the original parity data OPD1. Hereafter, examples of parity the substitution operation and the parity restoration operation will be described in some additional detail.

The ECC decoder 114 may receive the main data MD2 and the original parity data OPD2 from the parity control circuit 111. The ECC decoder 114 may be configured to detect and correct error(s) in the main data MD2 by decoding the main data MD2 using the original parity data OPD2 and the ECC. In this manner, the ECC decoder 114 may generate corrected main data.

The ECC decoder 114 may provide the corrected data, along with ECC status information to the analysis circuit 115. Examples of ECC status information have described in relation to FIG. 4A.

The analysis circuit 115 may receive the ECC status information and the corrected main data from the ECC decoder 114. The analysis circuit 115 may generate test results, based on the ECC status information and the corrected main data, and send the test results to an external device (e.g., a test controller, not shown). Examples of test results have been described in relation to FIG. 4A.

As described above, because bit "0" is included in parity data (e.g., "14h'0568"), the comparative BIST logic circuit 10 of FIG. 4A must change position of parity data such that at least a first test operation and a second test operation are performed. Extending the working example, because the number of 0s included in the parity data is nine (9), the comparative BIST logic circuit 10 may cover about 90% of all memory cells in a memory module using one test.

In notable contrast, the BIST logic circuit 110a according to embodiments of the inventive concept may perform testing using the substituted parity data, instead of original parity data. And in this case, because the write data are 78-bit data and the number of 0s included in the parity data is 0, the BIST logic circuit 110a may cover 100% of all the memory cells in the memory module using one test. That is, even though a position of parity data has not been changed, the BIST logic circuit 110a may perform reliability testing on all memory cells of the memory module over a reduced period of time, without reducing testing accuracy.

Figure 6:
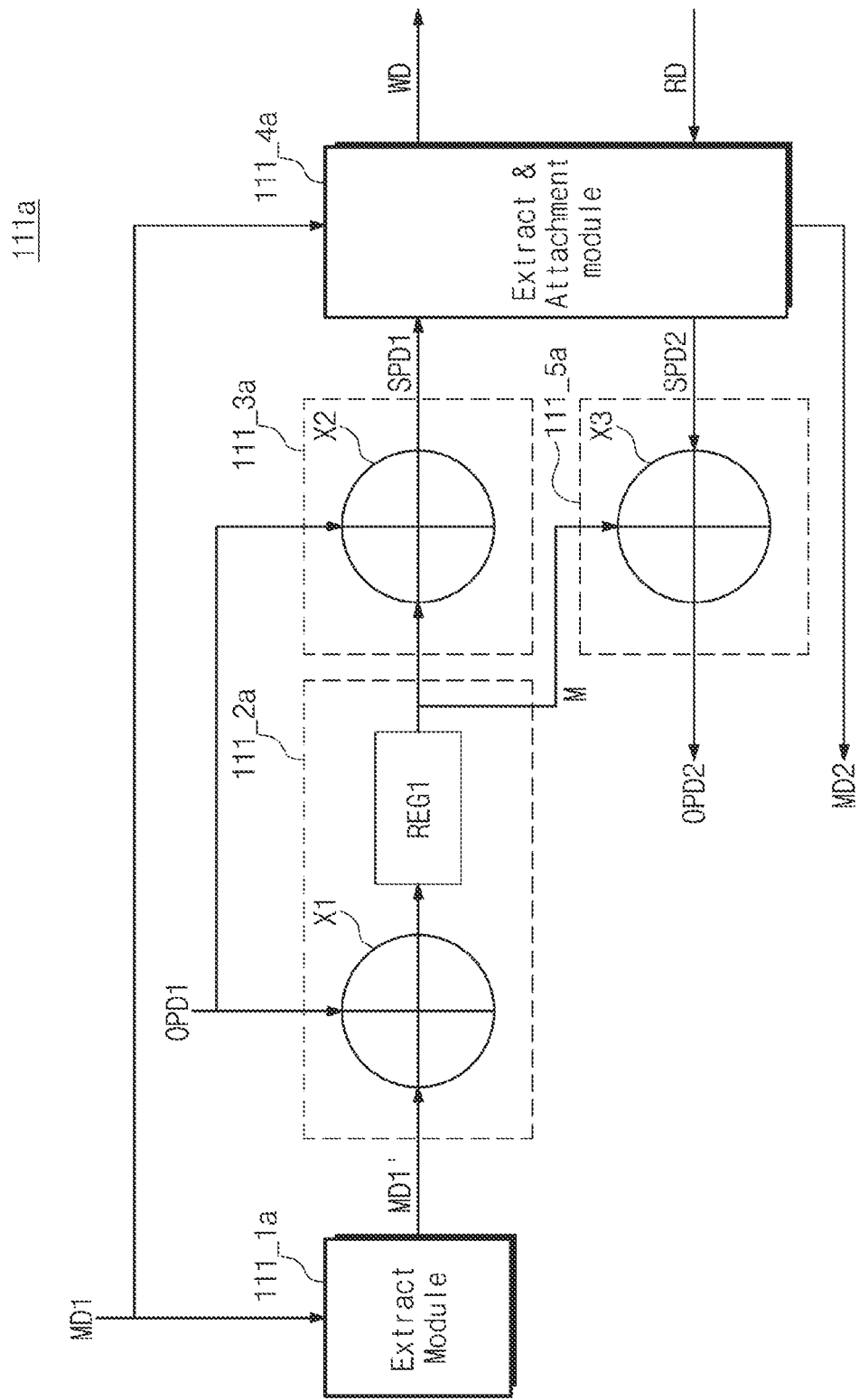
FIG. 6 is a block diagram further illustrating in one example 111a the parity control circuit 111 of FIG. 5.

FIG. 6 is a block diagram further illustrating in one example the parity control circuit 110a of FIG. 5. Referring to FIGS. 1, 5, and 6, the parity control circuit 111a may include an extract module 111_1a, a mask generating module 111_2a, a parity substituting module 111_3a, an extract and attachment module 111_4a, and a parity restoring module 111_5a.

Using these components, the parity control circuit 111a may perform the parity substitution operation and the parity restoration operation. For example, the parity control circuit 111a may receive the main data MD1 and the original parity data OPD1 from the ECC encoder 113. The parity control circuit 111a may generate the substituted parity data SPD1, based on the main data MD1 and the original parity data OPD1. The parity control circuit 111a may provide the memory module 120 with the write data WD including the main data MD1 and the substituted parity data SPD1.

The parity control circuit 111a may receive the read data RD from the memory module 120. The parity control circuit 111a may restore the substituted parity data SPD2 included in the read data RD into the original parity data OPD2. The parity control circuit 111a may provide the main data MD2 and the original parity data OPD2 to the ECC decoder 114.

Each of the main data MD1 and MD2 may be M-bit data ('M' being a positive number). Each of the original parity data OPD1 and the original parity data OPD2 may be K-bit data ('K' being a positive number). Each of the substituted parity data SPD1 and SPD2 may be K-bit data ('K' being a positive number). Each of the write data WD and the read data RD may be N-bit data (N=(M+K), and N>K).

The extract module 111_1a may receive the main data MD1 provided from the ECC encoder 113. The extract module 111_1a may extract a main data portion MD1', which is necessary to generate mask data, from the main data MD1. The extract module 111_1a may provide the main data portion MD1' to the mask generating module 111_2a. The number of bits of the main data portion MD1' may correspond to the number of bits of the original parity data OPD1. That is, the number of bits of the main data portion MD1' may be the same as the number of bits of the original parity data OPD1.

For example, because the original parity data OPD1 are K-bit data, the main data portion MD1' may be K-bit data. The main data portion MD1' may include K bits being consecutive from among 0-th to (M−1)-th bits of the main data MD1. Alternately, the main data portion MD1' may include K bits being not consecutive from among the 0-th to (M−1)-th bits of the main data MD1.

For example, when the main data portion MD1' includes K bits being consecutive from among the 0-th to (M−1)-th bits of the main data MD1, the main data portion MD1' may include 0-th to (K−1)-th bits of the main data MD1 or (M−K)-th to (M−1)-th bits of the main data MD1.

In some embodiments, bits of the main data MD1 constituting the main data portion MD1' may be determined in advance depending on the main data MD1. That is, a position of bits that are extracted from the main data MD1 by the extract module 111_1a may be determined in advance depending on a test pattern. For example, in an initialization process, the main data portion MD1' may be determined in advance to include the 0-th to (K−1)-th bits or the (M−K)-th to (M−1)-th bits of the main data MD1.

The mask generating module 111_2a may receive the original parity data OPD1 provided from the ECC encoder 113. The mask generating module 111_2a may receive the main data portion MD1' provided from the extract module 111_1a. The mask generating module 111_2a may generate mask data "M" based on the main data portion MD1' and the original parity data OPD1 and may store the mask data "M". The mask generating module 111_2a may provide the mask data "M" to the parity substituting module 111_3a and the parity restoring module 111_5a.

For example, the mask data "M" may be used to convert the original parity data OPD1 into the substituted parity data SPD1, and may be used to restore the substituted parity data SPD2 to the original parity data OPD2. For example, when main data are a bit stream composed of bit "1", the mask data "M" may indicate a value indicating a position of bit "0" of the original parity data OPD1.

In some embodiments, the mask generating module 111_2a may include a first XOR operator X1 and a first register REG1. The first XOR operator X1 may receive the main data portion MD1' provided from the extract module 111_1a. The first XOR operator X1 may receive the original parity data OPD1 provided from the ECC encoder 113. The first XOR operator X1 may perform an XOR operation on the main data portion MD1' and the original parity data OPD1. An output value of the first XOR operator X1 may indicate the mask data "M". The first XOR operator X1 may provide the mask data "M" to the first register REG1.

The mask generating module 111_2a may store the mask data "M" in the first register REG1. The mask generating module 111_2a may provide the mask data "M" to the parity substituting module 111_3a and the parity restoring module 111_5a.

The parity substituting module 111_3a may receive the original parity data OPD1 from the ECC encoder 113. The parity substituting module 111_3a may receive the mask data "M" from the mask generating module 111_2a. The parity substituting module 111_3a may generate the substituted parity data SPD1, based on the mask data "M" and the original parity data OPD1. The parity substituting module 111_3a may provide the substituted parity data SPD1 to the extract and attachment module 111_4a.

In some embodiments, the number of 1's included in the substituted parity data SPD1 may decrease, as compared with the number of 1's in the original parity data OPD1. For example, the parity substituting module 111_3a may generate the substituted parity data SPD1 by converting all bits of "0" included in the original parity data OPD1 into bit "1". For example, when a main data portion is a bit stream composed of bit "1" and a value of the original parity data OPD1 is "14'h0568", the parity substituting module 111_3a may generate the substituted parity data SPD1 having a value of "14'h3FFF" by converting all bits of "0" included in the original parity data OPD1 into bit "1".

A "data pattern" may be understood defining an arrangement of bit values for a specific unit of data. Thus, a data pattern may include "4'b1111", "4'b0000", "4'b1010", "4'b1001", etc. Alternately, a data pattern may define an arrangement rule for a bit string. For example, an arrangement rule for a bit string including the main data MD1 may be the same as an arrangement rule for a bit string including the substituted parity data.

In some embodiments, a data pattern of the substituted parity data SPD1 may be the same as (or similar to) a data pattern of the main data MD1 (or the main data portion MD1'). That is, the data pattern of the main data portion MD1' may be the same as the data pattern of the substituted parity data SPD1. Accordingly, a portion of a data pattern of the main data MD1 may be the same as the data pattern of the substituted parity data SPD1.

When main data are a bit stream composed of bit "1", the parity substituting module 111_3a may convert the original parity data OPD1 having a value of "14h'0568" into the substituted parity data SPD1 having a value of "14'h3FFF" (i.e., into a bit stream composed of bit "1").

In some embodiments, the parity substituting module 111_3a may include a second XOR operator X2. The second XOR operator X2 may receive the original parity data OPD1 from the ECC encoder 113. The second XOR operator X2 may receive the mask data "M" from the mask generating module 111_2a. The second XOR operator X2 may perform an XOR operation on the original parity data OPD1 and the mask data "M". An output value of the second XOR operator X2 may indicate the substituted parity data SPD1. The second XOR operator X2 may provide the substituted parity data SPD1 to the extract and attachment module 111_4a.

The extract and attachment module 111_4a may receive the main data MD1 from the ECC encoder 113. The extract and attachment module 111_4a may receive the substituted parity data SPD1 from the parity substituting module 111_3a. The extract and attachment module 111_4a may generate the write data WD based on the main data MD1 and the substituted parity data SPD1. The extract and attachment module 111_4a may provide the write data WD to the memory module 120. For example, the extract and attachment module 111_4a may provide a write command, an address, and the write data WD to the memory module 120.

For example, the write data WD may include the main data MD1 and the substituted parity data SPD1. For example, 0-th to (K−1)-th bits of the write data WD may correspond to the substituted parity data SPD1, and K-th to (N−1)-th bits of the write data WD may correspond to the main data MD1. Alternately, 0-th to (M−1)-th bits of the write data WD may correspond to the main data MD1, and M-th to (N−1)-th bits of the write data WD may correspond to the substituted parity data SPD1.

The extract and attachment module 111_4a may receive the read data RD from the memory module 120. For example, the extract and attachment module 111_4a may send a read command and an address and may receive the read data RD corresponding to the address. The extract and attachment module 111_4a may extract the main data MD2 and the substituted parity data SPD2 based on the read data RD. The extract and attachment module 111_4a may provide the substituted parity data SPD2 to the parity restoring module 111_5a. The extract and attachment module 111_4a may provide the main data MD2 to the ECC decoder 114.

The parity restoring module 111_5a may receive the substituted parity data SPD2 from the extract and attachment module 111_4a. The parity restoring module 111_5a may receive the mask data "M" from the mask generating module 111_2a. The parity restoring module 111_5a may generate the original parity data OPD2, based on the substituted parity data SPD2 of the read data RD and the mask data "M". The parity restoring module 111_5a may provide the original parity data OPD2 to the ECC decoder 114.

In some embodiments, the parity restoring module 111_5a may include a third XOR operator X3. The third XOR operator X3 may receive the substituted parity data SPD2 from the extract and attachment module 111_4a. The third XOR operator X3 may receive the mask data "M" from the mask generating module 111_2a. The third XOR operator X3 may perform an XOR operation on the substituted parity data SPD2 and the mask data "M". An output value of the third XOR operator X3 may indicate the original parity data OPD2. The third XOR operator X3 may provide the original parity data OPD2 to the ECC decoder 114.

Figure 7:
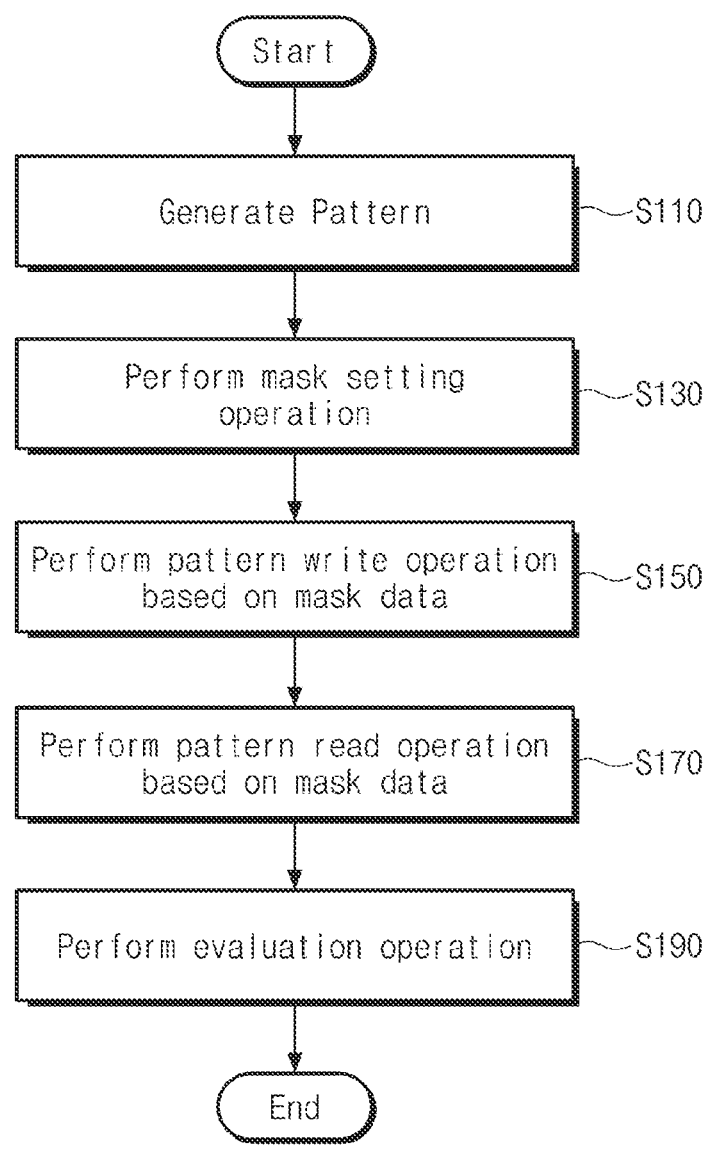
FIG. 7 is a flowchart illustrating an exemplary operation of the BIST logic circuit 110 of FIG. 1.
Figure 10A:
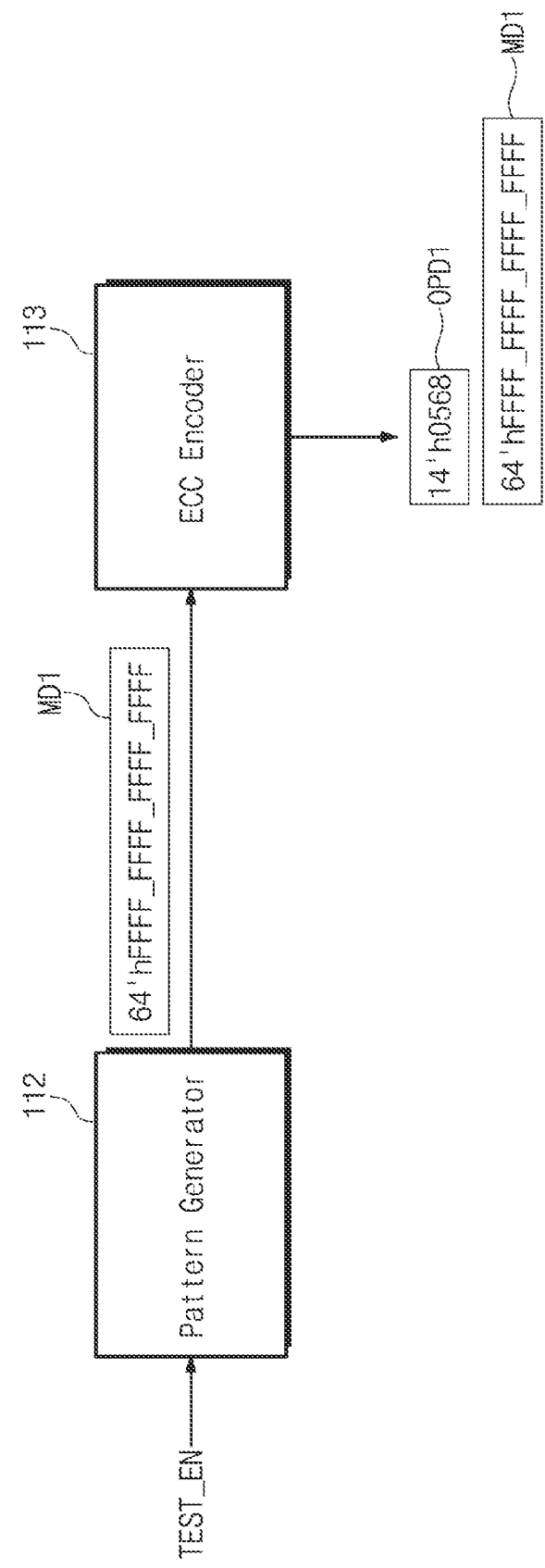

FIG. 7 is a flowchart illustrating in one example operation of the BIST logic circuit 110 of FIG. 1 and/or the BIST logic circuit 110a of FIG. 5. Referring to FIGS. 1, 5 and 7, the BIST logic circuit 110/110a may generate a pattern or the main data MD1 (S110). For example, the BIST logic circuit 110/110a may receive the test enable signal TEST_EN from an external device or a test device. The BIST logic circuit 110/110a may generate the main data MD1 in response to the test enable signal TEST_EN. The main data MD1 may be implemented with a bit stream composed of bit "1", a bit stream composed of bit "0", or a random pattern. However, the inventive concept is not limited thereto. For example, the main data MD1 may be implemented in various formats depending on test types or manners. For example, as illustrated in FIG. 10A, the pattern generator 112 may generate the main data MD1 in response to the test enable signal TEST_EN. A value of the main data MD1 may be "64'hFFFF_FFFF_FFFF_FFFF"

The BIST logic circuit 110/110a may perform an operation of setting the mask data "M" (S130). For example, the BIST logic circuit 110/110a may generate the mask data "M" based on the original parity data OPD1 and the main data MD1 and may store the mask data "M" in a register. As described above, the mask data "M" may be used in the parity substitution operation or the parity restoration operation.

The BIST logic circuit 110/110a may perform a pattern write operation on the memory module 120 based on the mask data "M" (S150). For example, the BIST logic circuit 110/110a may perform the pattern write operation for the purpose of testing a write failure of the memory module 120.

In some embodiments, writing, at the BIST logic circuit 110/110a, the pattern (or the write data WD) in the memory module 120 may include sending, at the BIST logic circuit 110, an address, a pattern, and a write command to the memory module 120; and writing, at the memory module 120, the pattern in memory cells corresponding to the address in response to the write command.

In various embodiments of the inventive concept, the terms "test pattern", "pattern", "data pattern", etc. may be used interchangeably. Such terms may have the same meaning or different meanings depending on the context of embodiments, and a meaning of each term may be understood depending on the context of embodiments to be described.

The BIST logic circuit 110/110a may perform a pattern read operation on the memory module 120 based on the mask data "M" (S170). For example, reading, at the BIST logic circuit 110/110a, the pattern (or the read data RD) from the memory module 120 may include sending, at the BIST logic circuit 110/110a, an address and a read command to the memory module 120; and receiving, at the BIST logic circuit 110, the corresponding pattern from memory cells from the memory module 120.

The BIST logic circuit 110/110a may evaluate the reliability of the memory module 120 (S190). For example, the BIST logic circuit 110/110a may evaluate the reliability of the memory module 120, based on ECC status information generated by the ECC decoder 114. The BIST logic circuit 110/110a may evaluate the reliability of the memory module 120 based on the main data MD2 corrected by the ECC decoder 114 and the main data MD2 included in the read data RD. The BIST logic circuit 110/110a may determine whether a memory failure occurs, a position (or an address) at which the memory failure occurs, the number of memory cells where the memory failure occurs, etc.

Figure 8:
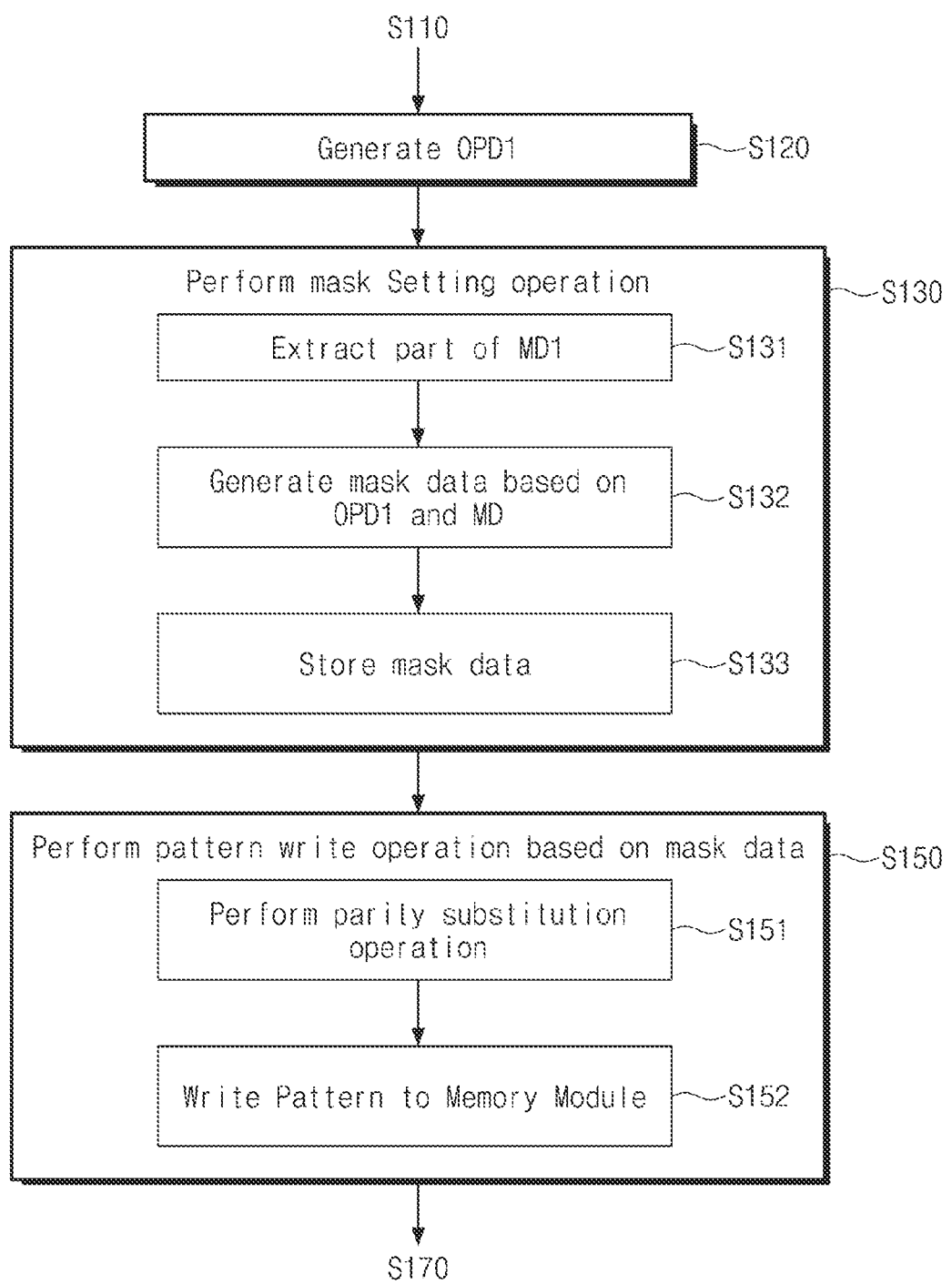
FIGS. 8 and 9 are related flowcharts further illustrating aspects of the operation of FIG. 7.
Figure 9:
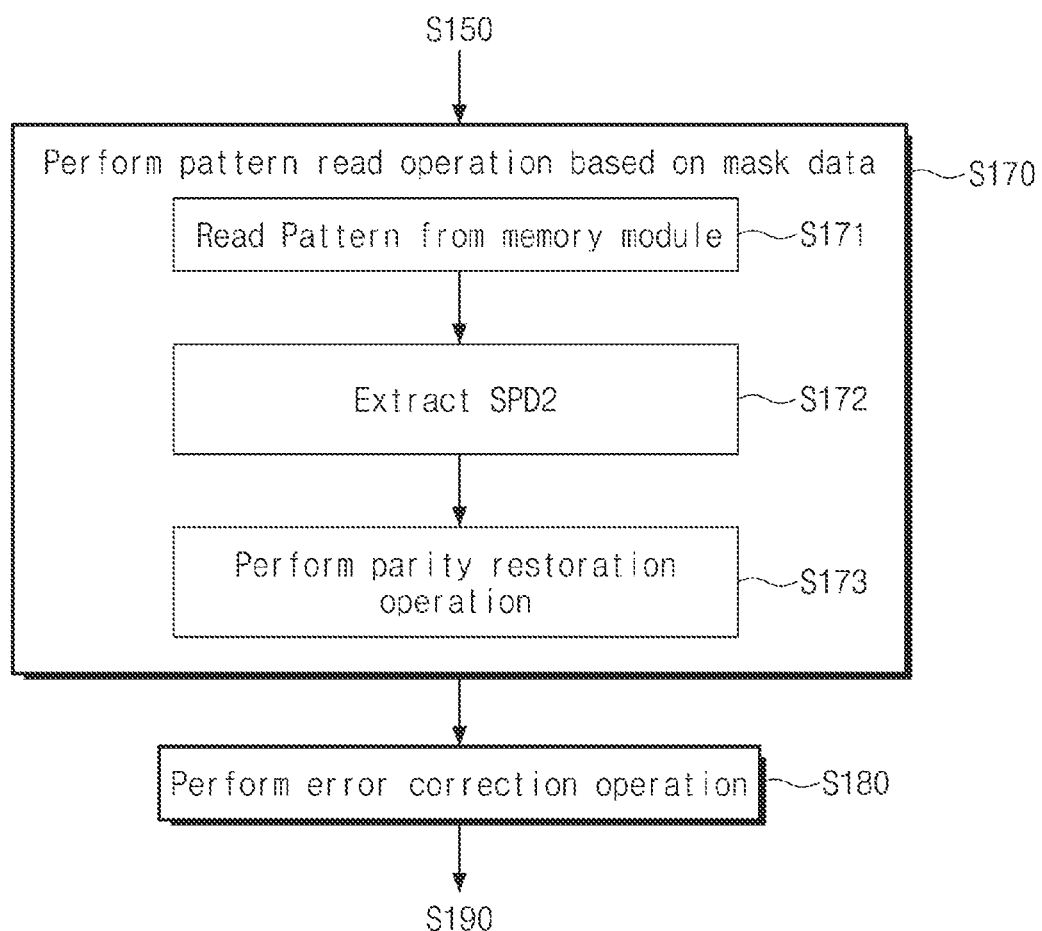
Figure 10B:
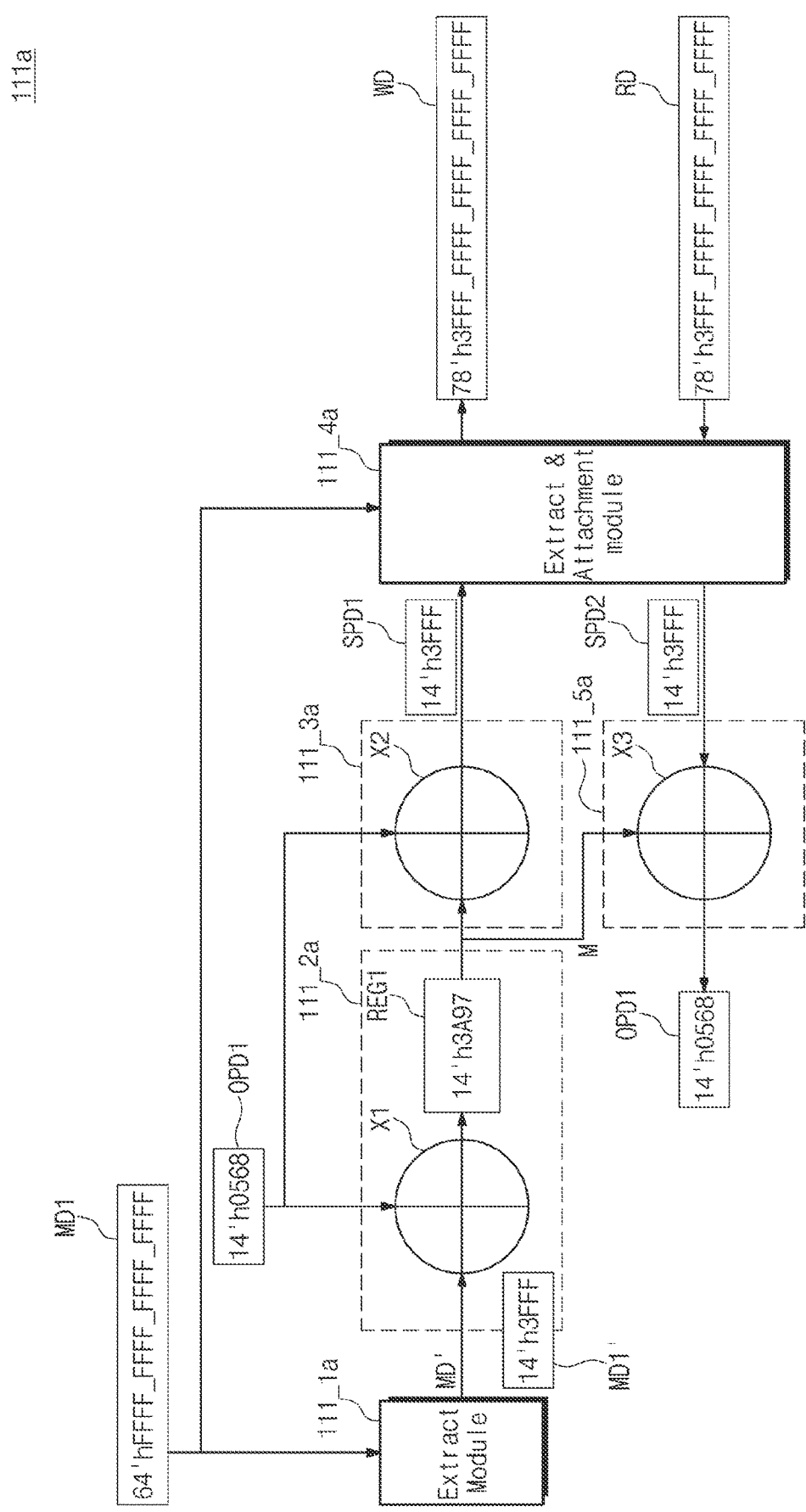

FIGS. 8 and 9 are respective flow diagrams further illustrating the method of FIG. 7. FIGS. 10A, 10B and 10C are respective diagrams illustrating operation of the parity control circuit 111 of FIG. 1.

Referring to FIGS. 1, 7 and 8, the BIST logic circuit 110 may perform operation S120 after operation S110. The BIST logic circuit 110 may generate parity data (e.g., the original parity data OPD1) (S120). For example, the ECC encoder 113 may generate the original parity data OPD1 from the generated main data MD1 by using the ECC. For example, as illustrated in FIG. 10A, the original parity data OPD1 may be "14h'0568".

The BIST logic circuit 110 may perform the mask setting operation (S130). Here, operation S130 may include operations S131, S132 and S133.

The BIST logic circuit 110 may extract the main data portion MD1' from the main data MD1 (S131). For example, the extract module 111_1a may receive the main data MD1 and may extract the main data portion MD1' from the main data MD1. In some embodiments, when original parity data are 14-bit data, the main data portion MD1' may be 14-bit data. That is, the main data portion MD1' may include 0-th to 13rd bits of the main data MD1, and a value of the main data portion MD1' may be "14h'3FFF".

The BIST logic circuit 110 may generate the mask data "M" based on the main data MD1 and the original parity data OPD1 (S132). For example, the parity control circuit 111 may generate the mask data "M" by performing an XOR operation on the main data portion MD1' and the original parity data OPD1. As illustrated in FIG. 10B, the mask generating module 111_2a may generate the mask data "M" by performing an XOR operation on the original parity data OPD1 having a value of "14'h0568" and the main data portion MD1' having a value of "14'h3FFF". The mask data "M" may be "14'h3A97".

The BIST logic circuit 110 may store the mask data "M". For example, the parity control circuit 111a may store the generated mask data "M" in the first register REG1 (S133).

The BIST logic circuit 110 may perform a pattern write operation based on the mask data "M" (S150). Here, operation S150 may include operations S151 and operation S152.

The BIST logic circuit 110 may perform the parity substitution operation (S151). That is, the BIST logic circuit 110 may convert the original parity data OPD1 into the substituted parity data SPD1. For example, the parity control circuit 111a may generate the substituted parity data SPD1 based on the mask data "M" and the original parity data OPD1. The parity control circuit 111a may generate the substituted parity data SPD1 by performing an XOR operation on the mask data "M" and the original parity data OPD1. As shown in FIG. 10B, a value of the substituted parity data SPD1 may be "14h'3FFF".

The BIST logic circuit 110 may write the pattern in the memory module 120 (S152). The BIST logic circuit 110 may write the pattern (or the write data WD) including the main data MD1 and the substituted parity data SPD1 in the memory module 120. As illustrated in FIG. 10B, the write data WD may be "78'h3FFF_FFFF_FFFF_FFFF_FFFF". The BIST logic circuit 110 may send a write command, an address, and the write data WD to the memory module 120. Thereafter, the BIST logic circuit 110 may perform operation S170.

As described above, the pattern of the substituted parity data SPD1 may be the same as or similar to a portion of the pattern of the main data MD1. That is, the pattern of the substituted parity data SPD1 may be the same as the pattern of the main data portion MD1'. As shown in FIG. 10B, because the main data portion MD1' is "14'h3FFF", the substituted parity data SPD1 may be "14'h3FFF".

The comparative BIST logic circuit 10 of FIG. 4A may write the original parity data different in pattern from the main data in a memory module, thereby causing a decrease in test coverage. In contrast, the BIST logic circuit 110 of FIG. 1 may generate substituted parity data identical in pattern to the main data MD1 so as to be written in the memory module 120. As such, even though parity data are additionally written in the memory module 120, the range of test coverage may be improved.

Referring to FIGS. 1, 7, 8 and 9, in operation S170—following operation S150—the BIST logic circuit 110 may perform a pattern read operation based on mask data. Here, operation S170 may include operations S171, S172 and S173.

The BIST logic circuit 110 may read a pattern (or the read data RD) from the memory module 120. For example, the BIST logic circuit 110 may send a read command and an address to the memory module 120 and may receive the read data RD (S171). As shown in FIG. 10B, the read data RD may be "78'h3FFF_FFFF_FFFF_FFFF_FFFF".

The parity control circuit 111a may extract the substituted parity data SPD2 from the read data RD (S172). As shown in FIG. 10B, a value of the substituted parity data SPD2 may be "14h'h3FFF".

The BIST logic circuit 110 may perform the parity restoration operation (S173). That is, the BIST logic circuit 110 may convert the substituted parity data SPD2 included in the read data RD into the original parity data OPD2. For example, the parity control circuit 111a may calculate the original parity data OPD2 based on the mask data "M" and the substituted parity data SPD2. The parity control circuit 111a may generate the original parity data OPD2 by performing an XOR operation on the mask data "M" and the substituted parity data SPD2. As shown in FIG. 10B, because the mask data "M" are "14'h3A97" and the substituted parity data SPD2 are "14'h3FFF", an output value of the third XOR operator X3 may be "14'h0568".

The BIST logic circuit 110 may perform an error correction operation (S180). For example, the ECC decoder 114 may correct an error of the main data MD2 based on the original parity data OPD2. That is, the ECC decoder 114 may correct an error of the main data MD2 caused by a memory failure of the memory module 120. Thereafter, the BIST logic circuit 110 may perform operation S190 of FIG. 7.

Relationships between the original parity data OPD1 and OPD2, the mask data "M", and the substituted parity data SPD1 and SPD2 will be described in relation to FIG. 10C. In this regard, the comparative BIST logic circuit 10 of FIG. 4A may store write data including parity data and main data in a memory module without parity data substitution. Accordingly, because at least one bit "0" is included in the parity data, it is impossible to accurately determine whether a failure occurs in a memory cell corresponding to a bit "0". As such, the comparative BIST logic circuit 10 must change a position of parity data, thereby requiring at least two test operations.

In contrast, the BIST logic circuit 110 of FIG. 1 performs the parity substitution operation of converting the original parity data OPD1 into the substituted parity data SPD1 using the mask data "M", and performing the parity restoration operation of converting the substituted parity data SPD2 into the original parity data OPD2.

In some embodiments, when the main data MD1 may be a bit stream composed of bit "1", the mask data "M" being a result value of performing an XOR operation on the main data portion MD1' and the original parity data OPD1 may be "14'h3A97". That is, bits of the mask data "M" corresponding to bits of "0" in the original parity data OPD1 may be "1", and bits of the mask data "M" corresponding to bits of "1" in the original parity data OPD1 may be "0".

For example, when a value of the original parity data OPD1 is "14'h0568", because 0th, 1st, 2nd, 4th, 7th, 9th, 11th, 12th, and 13th bits of the original parity data OPD1 have a value of "0", 0th, 1st, 2nd, 4th, 7th, 9th, 11th, 12th, and 13th bits of the mask data "M" may have a value of "1". Because 3rd, 5th, 6th, 8th, and 10th bits of the original parity data OPD1 have a value of "1", 3rd, 5th, 6th, 8th, and 10th bits of the mask data "M" may have a value of "0".

The parity control circuit 111a may generate the substituted parity data SPD1 by performing an XOR operation on the mask data "M" and the original parity data OPD1. Because values of bits of the original parity data OPD1 are different from values of corresponding bits of the mask data "M", the substituted parity data SPD1 may be a bit stream composed of bit "1". That is, the substituted parity data SPD1 may be "14'h3FFF". As such, because both the substituted parity data SPD1 and the main data MD1 are implemented with a bit stream composed of bit "1", without changing a position of parity data, the BIST logic circuit 110 may perform a reliability test on all memory cells in a memory module using only one test operation.

Because the BIST logic circuit 110 stores the mask data "M" in the first register REG1, the BIST logic circuit 110 may restore the substituted parity data SPD2 to the original parity data OPD2 by using the mask data "M" in the parity restoration operation.

$$T = P \hat{} M \qquad \text{[Equation 1]}$$

$$P = T \hat{} M \qquad \text{[Equation 2]}$$

The BIST logic circuit 110 may restore the original parity data OPD2 through the parity restoration operation by using Equation 1 and Equation 2. "T" may be the substituted parity data SPD1, "P" may be the original parity data OPD1, and "M" may be the mask data "M". That is, the substituted parity data SPD1 may be a result value of performing an XOR operation on the original parity data OPD1 and the mask data "M". Accordingly, the original parity data OPD2 may be a result value of performing an XOR operation on the substituted parity data SPD2 and the mask data "M".

As described above, the parity control circuit 111a may substitute for the original parity data OPD1 to generate the substituted parity data SPD1. The number of 0s included in the substituted parity data SPD1 may be smaller than the number of 0s included in the original parity data OPD1. As such, a test coverage of a memory module may be improved.

Figure 11A:
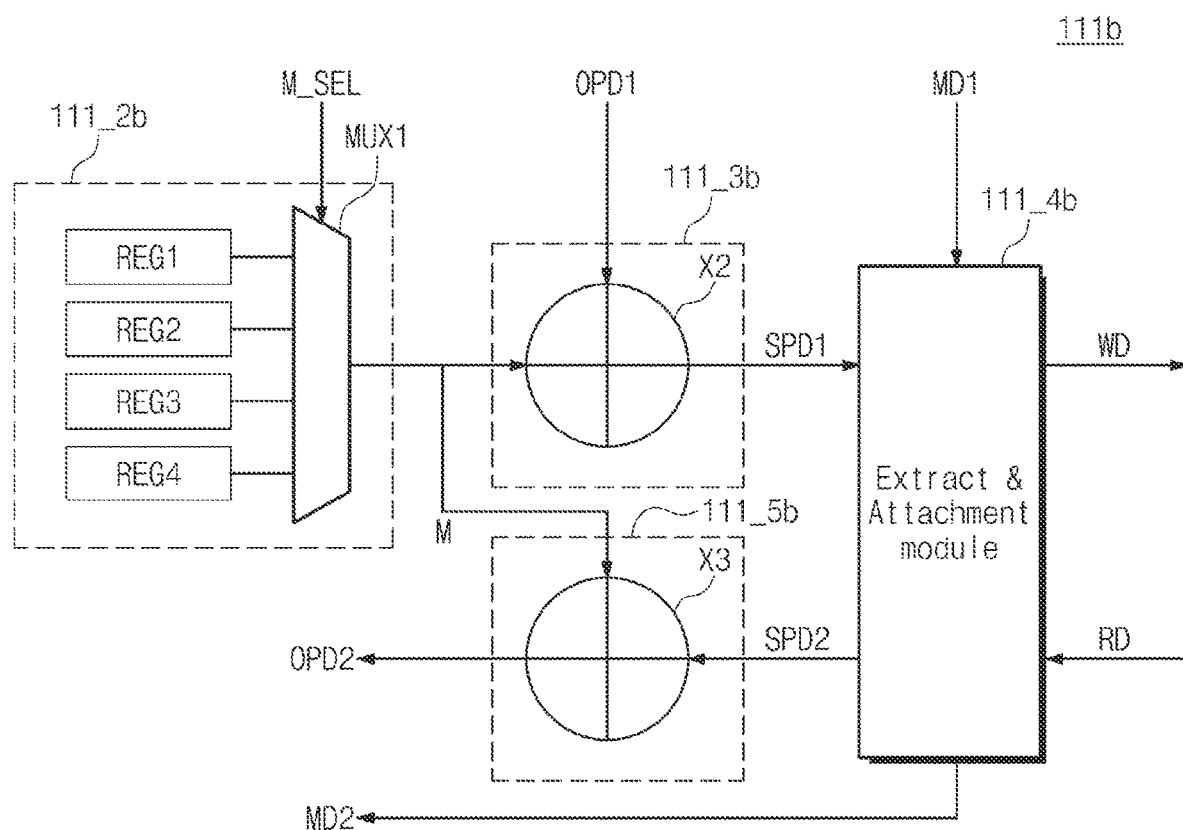
FIGS. 11A, 11B and 11C are related block diagrams further illustrating in another example the operation of the parity control circuit 111 of FIG. 1.
Figure 11B:
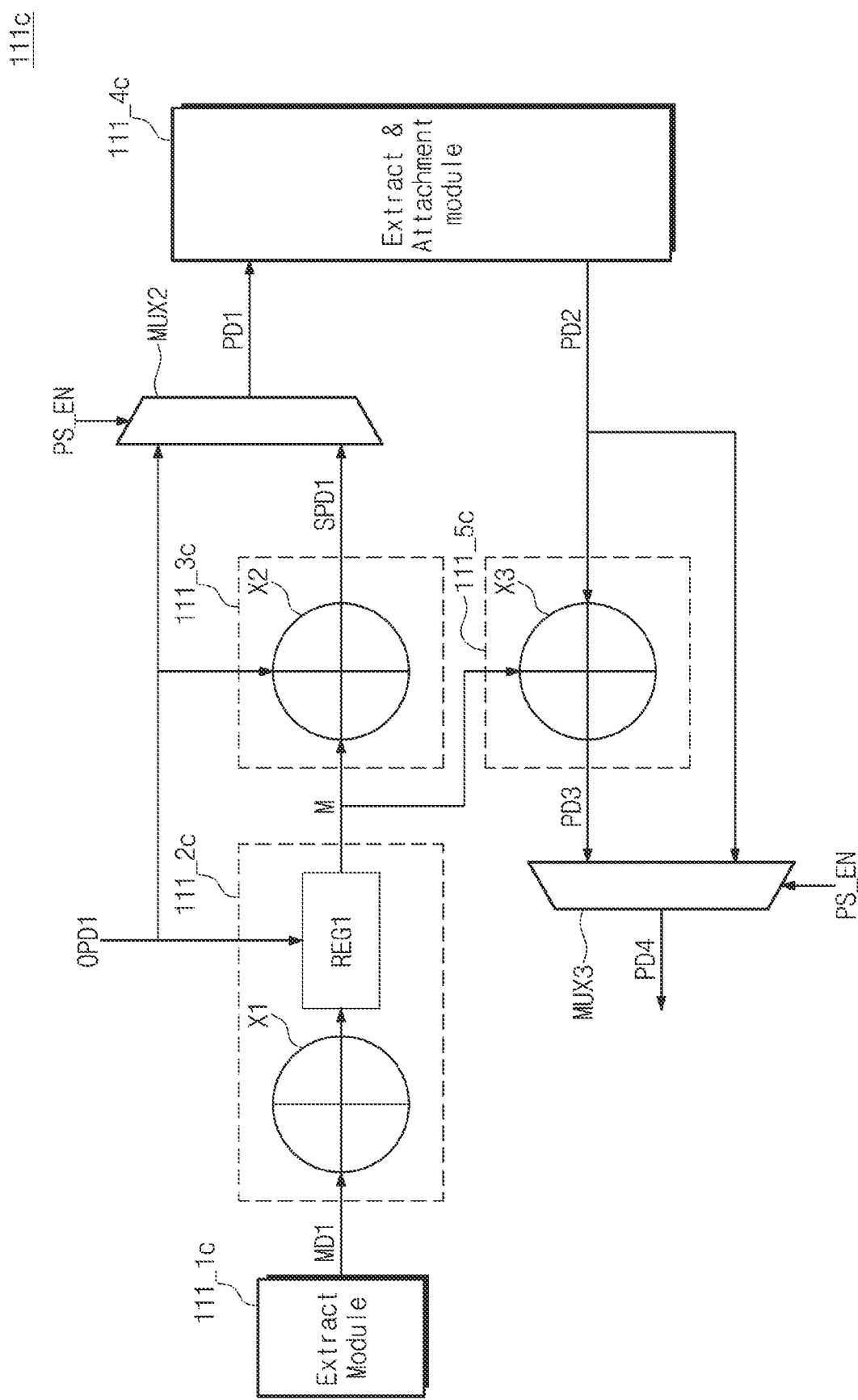
Figure 11C:
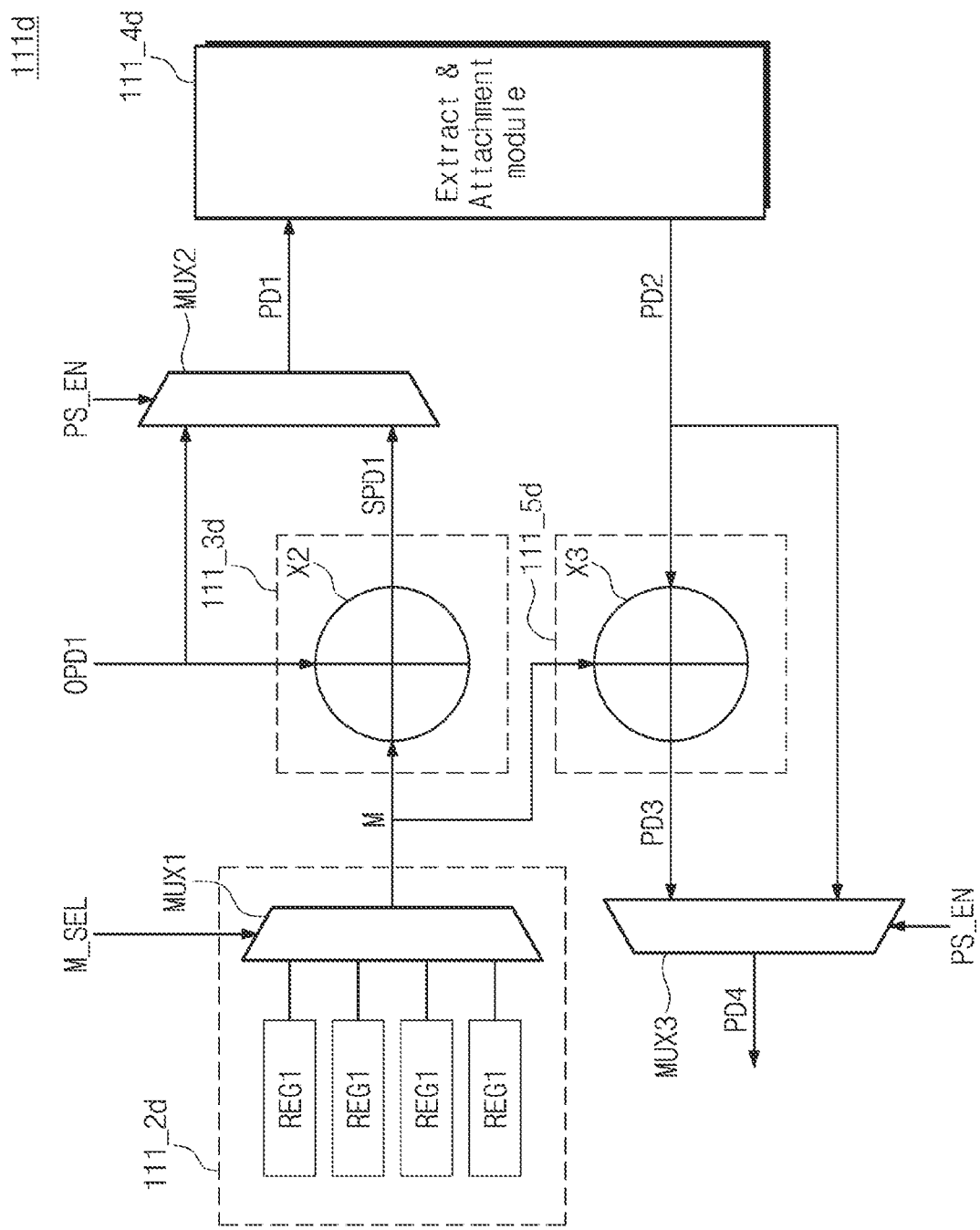

FIGS. 11A, 11B and 11C are respective block diagrams variously and further illustrating the parity control circuit 111 of FIG. 1.

Referring to FIG. 11A, a parity control circuit 111b may include a mask generating module 111_2b, a parity substituting module 111_3b, an extract and attachment module 111_4b, and a parity restoring module 111_5b. The parity control circuit 111b may receive the main data MD1 and the original parity data OPD1 from the ECC encoder 113. The parity control circuit 111b may receive a mask selection signal M_SEL from the pattern generator 112. Alternately, the parity control circuit 111b may receive the mask selection signal M_SEL from an external device (not illustrated) (or a test device).

Compared to FIG. 6, the parity control circuit 111b of FIG. 11A may not include the extract module 111_1a that generates the main data portion MD1'. The parity control circuit 111b may not generate mask data based on the main data portion MD1' and the original parity data OPD1. The parity substituting module 111_3b may include the second XOR operator X2. The parity restoring module 111_5b may include the third XOR operator X3. The second and third XOR operators X2 and X3 are described with reference to FIG. 6, and thus, additional description will be omitted to avoid redundancy.

The mask generating module 111_2b may include a plurality of registers REG1 to REG4, and a first multiplexer MUX1. The mask generating module 111_2b may receive the mask selection signal M_SEL and may output the mask data "M". The mask generating module 111_2b may store a plurality of mask data "M" in the registers REG1 to REG4 in the initialization process as far as possible.

The mask generating module 111_2a of FIG. 6 may generate the mask data "M" by performing an XOR operation on the main data portion MD1' and the original parity data OPD1. On the other hand, the mask generating module 111_2b of FIG. 11A may not generate the mask data "M" through the XOR operation, but it may output the mask data "M" stored in the plurality of registers REG1 to REG4 in response to the mask selection signal M_SEL.

In some embodiments, the plurality of mask data "M" may be determined depending on a test pattern. The pattern generator 112 may generate various forms of test patterns but may generate only first to fourth test patterns. When the pattern generator 112 generates only the first to fourth test patterns, the plurality of mask data "M" may be calculated in advance and may be stored in the first to fourth registers REG1 to REG4 in the initialization process.

The BIST logic circuit 110 may generate first to fourth parity data respectively corresponding to the first to fourth test patterns. The BIST logic circuit 110 may generate first to fourth mask data respectively associated with the first to fourth parity data.

For example, the first mask data may be stored in the first register REG1, the second mask data may be stored in the second register REG2, the third mask data may be stored in the third register REG3, and the fourth mask data may be stored in the fourth register REG4. An example as the mask generating module 111_2b is capable of storing four mask data "M" is illustrated, but the inventive concept is not limited thereto. For example, the number of mask data capable of being stored may increase or decrease depending on a way to implement.

The first multiplexer MUX1 may output the mask data "M" stored in a register, which is selected in response to the mask selection signal M_SEL, from among the plurality of registers REG1 to REG4. For example, when the mask selection signal M_SEL indicates the second register REG2, the first multiplexer MUX1 may output the mask data "M" stored in the second register REG2.

Referring to FIG. 11B, a parity control circuit 111c may include an extract module 111_1c, a mask generating module 111_2c, a parity substituting module 111_3c, an extract and attachment module 111_4c, a parity restoring module 111_5c, a second multiplexer MUX2, and a third multiplexer MUX3. The mask generating module 111_2c may include the first XOR operator X1 and the first register REG1. The parity substituting module 111_3c may include the second XOR operator X2. The parity restoring module 111_5c may include the third XOR operator X3. The mask generating module 111_2c, the second XOR operator X2, and the third XOR operator X3 are described with reference to FIG. 6, and thus, additional description will be omitted to avoid redundancy.

Compared to FIG. 6A, the parity control circuit 111c may receive a parity substitution enable signal PS_EN. The parity substitution enable signal PS_EN may be received from the pattern generator 112. Alternately, the parity substitution enable signal PS_EN may be received from an external device (not illustrated).

For example, the parity substitution enable signal PS_EN may be a signal for selecting whether to perform the parity substitution operation and the parity restoration operation. In response to the parity substitution enable signal PS_EN, the parity control circuit 111c may determine whether to write the write data including substituted parity data or whether to write the write data including original parity data.

For example, when the parity substitution enable signal PS_EN indicates an enable state, the parity control circuit 111c may write the write data WD including the substituted parity data SPD1 in the memory module 120. When the parity substitution enable signal PS_EN indicates a disable state, the parity control circuit 111c may write the write data WD including the original parity data OPD1 in the memory module 120.

In some embodiments, the second multiplexer MUX2 may receive the parity substitution enable signal PS_EN. The second multiplexer MUX2 may receive the original parity data OPD1 and the substituted parity data SPD1. In response to the parity substitution enable signal PS_EN, the second multiplexer MUX2 may output one of the original parity data OPD1 and the substituted parity data SPD1 to the extract and attachment module 111_4c as first parity data PD1.

For example, when the parity substitution enable signal PS_EN indicates the enable state, the second multiplexer MUX2 may output the substituted parity data SPD1 as the first parity data PD1. When the parity substitution enable signal PS_EN indicates the disable state, the second multiplexer MUX2 may output the original parity data OPD1 as the first parity data PD1.

In some embodiments, the third multiplexer MUX3 may receive the parity substitution enable signal PS_EN. The third multiplexer MUX3 may receive third parity data PD3 from the parity restoring module 111_5c. The third multiplexer MUX3 may receive second parity data PD2 from the extract and attachment module 111_4c.

In some embodiments, the parity restoring module 111_5c may receive the second parity data PD2 from the extract and attachment module 111_4c. The second parity data PD2 may be parity data generated by the parity substituting module 111_3c or may be original parity data. That is, when the parity substitution enable signal PS_EN indicates the enable state, the second parity data PD2 may correspond to the substituted parity data SPD1. When the parity substitution enable signal PS_EN indicates the disable state, the second parity data PD2 may correspond to the original parity data OPD1.

The parity restoring module 111_5c may output the third parity data PD3 to the third multiplexer MUX3 based on the second parity data PD2 and the mask data "M". The third parity data PD3 may be the same as or different from the original parity data OPD1. That is, when the parity substitution enable signal PS_EN indicates the enable state, the third parity data PD3 may correspond to the original parity data OPD1.

That is, when the parity substitution enable signal PS_EN indicates the enable state, the second parity data PD2 may be the same as the substituted parity data SPD1, and the third parity data PD3 may be the same as the original parity data OPD1. On the other hand, when the parity substitution enable signal PS_EN indicates the disable state, the second parity data PD2 may be different from the substituted parity data SPD1, and the third parity data PD3 may be different from the original parity data OPD1.

The third multiplexer MUX3 may receive the parity substitution enable signal PS_EN. The third multiplexer MUX3 may receive the third parity data PD3 from the parity restoring module 111_5c. The third multiplexer MUX3 may receive the second parity data PD2 from the extract and attachment module 111_5c. In response to the parity substitution enable signal PS_EN, the third multiplexer MUX3 may output one of the third parity data PD3 and the second parity data PD2 as fourth parity data PD4. The third multiplexer MUX3 may provide the fourth parity data PD4 to the ECC decoder 114.

For example, when the parity substitution enable signal PS_EN indicates the enable state, the third multiplexer MUX3 may output the third parity data PD3 as the fourth parity data PD4. When the parity substitution enable signal PS_EN indicates the disable state, the third multiplexer MUX3 may output the second parity data PD2 as the fourth parity data PD4.

Referring to FIG. 11C, a parity control circuit 111d may include a mask generating module 111_2d, a parity substituting module 111_3d, an extract and attachment module 111_4d, a parity restoring module 111_5d, the second multiplexer MUX2, and the third multiplexer MUX3. Compared to FIG. 6, the parity control circuit 111d may not include the extract module 111_1a. The parity control circuit 111d may further receive the mask selection signal M_SEL and the parity substitution enable signal PS_EN.

The mask generating module 111_2d may include the plurality of registers REG1 to REG4, and the first multiplexer MUX1. The mask generating module 111_2d is described with reference to FIG. 11A, and thus, additional description will be omitted to avoid redundancy.

The parity substituting module 111_3d may include the second XOR operator X2. The parity restoring module 111_5d may include the third XOR operator X3. The parity substituting module 111_3d and the parity restoring module 111_5d are described with reference to FIG. 6, and thus, additional description will be omitted to avoid redundancy. The second multiplexer MUX2 and the third multiplexer MUX3 are described with reference to FIG. 11B, and thus, additional description will be omitted to avoid redundancy.

Figure 12:
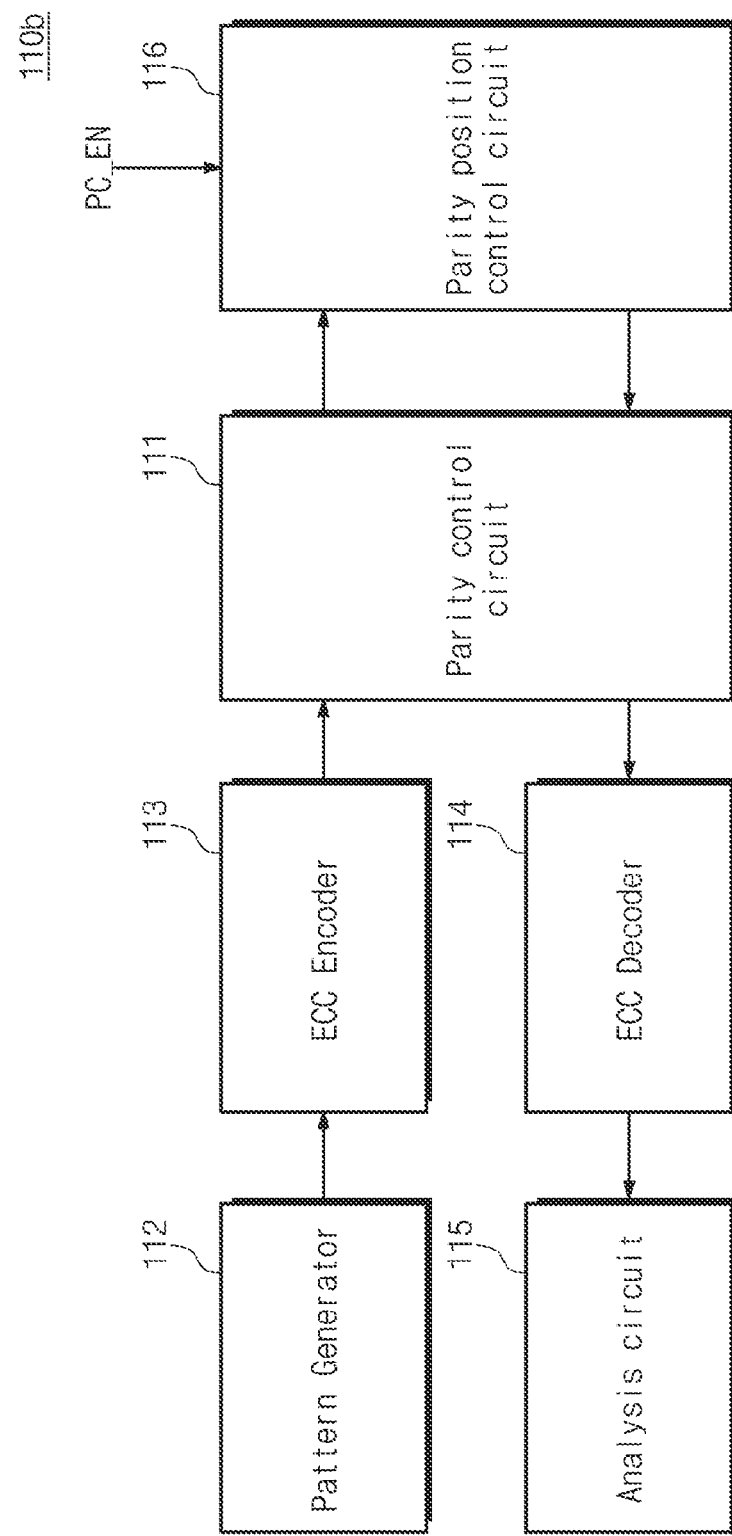
FIG. 12 is a block diagram further illustrating in still another example 110b the BIST logic circuit 110 of FIG. 1 according to embodiments of the inventive concept.

FIG. 12 is a block diagram illustrating in another example (110b) the BIST logic circuit 110 of FIG. 1. Referring to FIGS. 1 and 12, the BIST logic circuit 110b may include the pattern generator 112, the ECC encoder 113, the parity control circuit 111, the ECC decoder 114, the analysis circuit 115, and a parity position control circuit 116. Compared to the comparative BIST logic circuit 10 of FIG. 4A, the BIST logic circuit 110b of FIG. 12 further includes the parity position control circuit 116.

Here, the parity position control circuit 116 may receive write data provided from the parity control circuit 111 and the position control enable signal PC_EN. The parity position control circuit 116 may control a position of parity data belonging to the write data in response to the position control enable signal PC_EN.

For example, when the position control enable signal PC_EN has a first logical value indicating a disabled state, the parity position control circuit 116 may provide the write data to the memory module 120 without changing the write data. Alternately, when the position control enable signal PC_EN has a second logical value indicating an enabled state, the parity position control circuit 116 may convert the write data such that a position of the parity data in the write data is changed and may provide the converted write data to the memory module 120.

The parity position control circuit 116 may receive read data that are read out from the memory module 120. When the position control enable signal PC_EN has the first logical value, the parity position control circuit 116 may provide the read data to the parity control circuit 111 without modification. When the position control enable signal PC_EN has the second logical value, the parity position control circuit 116 may change a position of the parity data in the read data so as to be provided to the parity control circuit 111.

Various test systems and/or memory systems according to embodiments of the inventive concept will now be described in relation to FIGS. 13A to 13F.

Figure 13A:
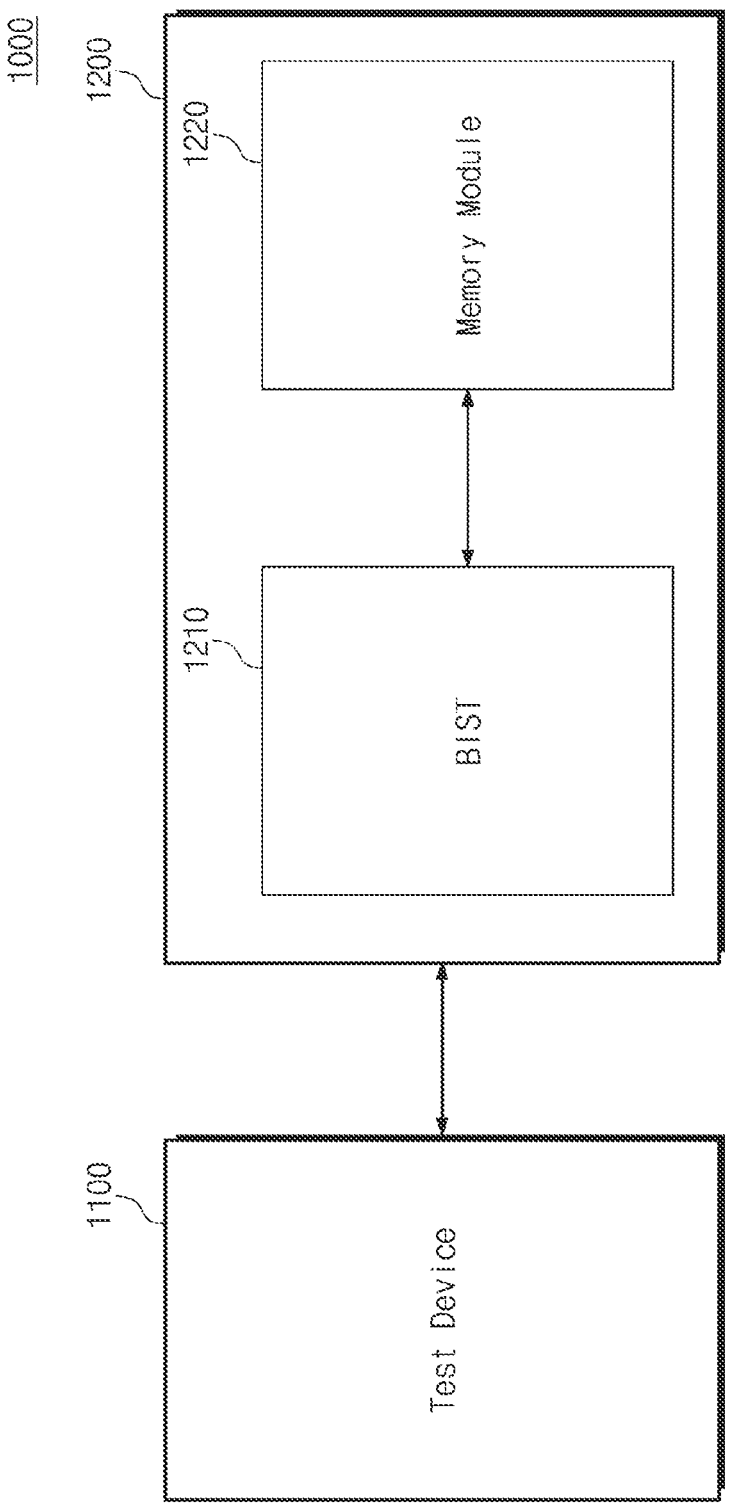
FIGS. 13A, 13B, 13C, 13D, 13E and 13F (hereafter collectively, "FIGS. 13A to 13F") are respective block diagrams illustrating a test system and/or memory system according to embodiments of the inventive concept.

FIG. 13A is a block diagram illustrating a test system according to an embodiment of the inventive concept. Referring to FIG. 13A, a test system 1000 may include a test device 1100 and a memory device 1200. The memory device 1200 may include BIST logic 1210 and a memory module 1220. The BIST logic 1210 may operate based on the test method described with reference to FIGS. 1 to 12.

In some embodiments, the test device 1100 may be automated test equipment (ATE) that tests the memory device 1200. The test device 1100 may output a signal for testing the memory device 1200 to the memory device 1200. For example, the test device 1100 may output the test enable signal TEST_EN for starting a test to the memory device 1200. The test device 1100 may receive a test result from the memory device 1200.

Figure 13B:
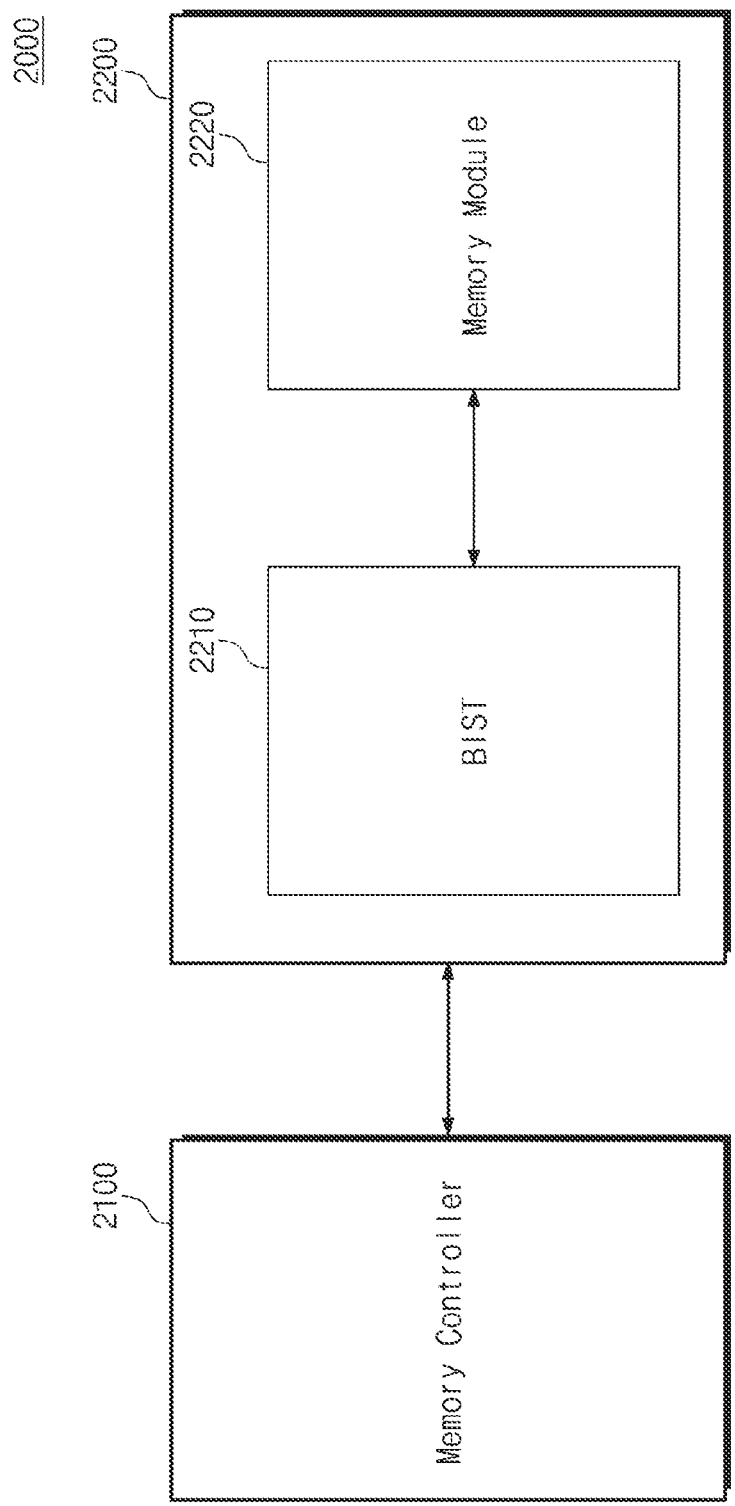

FIG. 13B is a block diagram illustrating a memory system according to an embodiment of the inventive concept. Referring to FIG. 13B, a memory system 2000 may include a memory controller 2100 and a memory device 2200. The memory controller 2100 may store data in the memory device 2200 or may read data stored in the memory device 2200. The memory device 2200 may operate under control of the memory controller 2100.

The memory device 2200 may include BIST logic 2210 and a memory module 2220. The BIST logic 1210 may operate based on test methods previously described in relation to embodiments of the inventive concept.

Figure 13C:
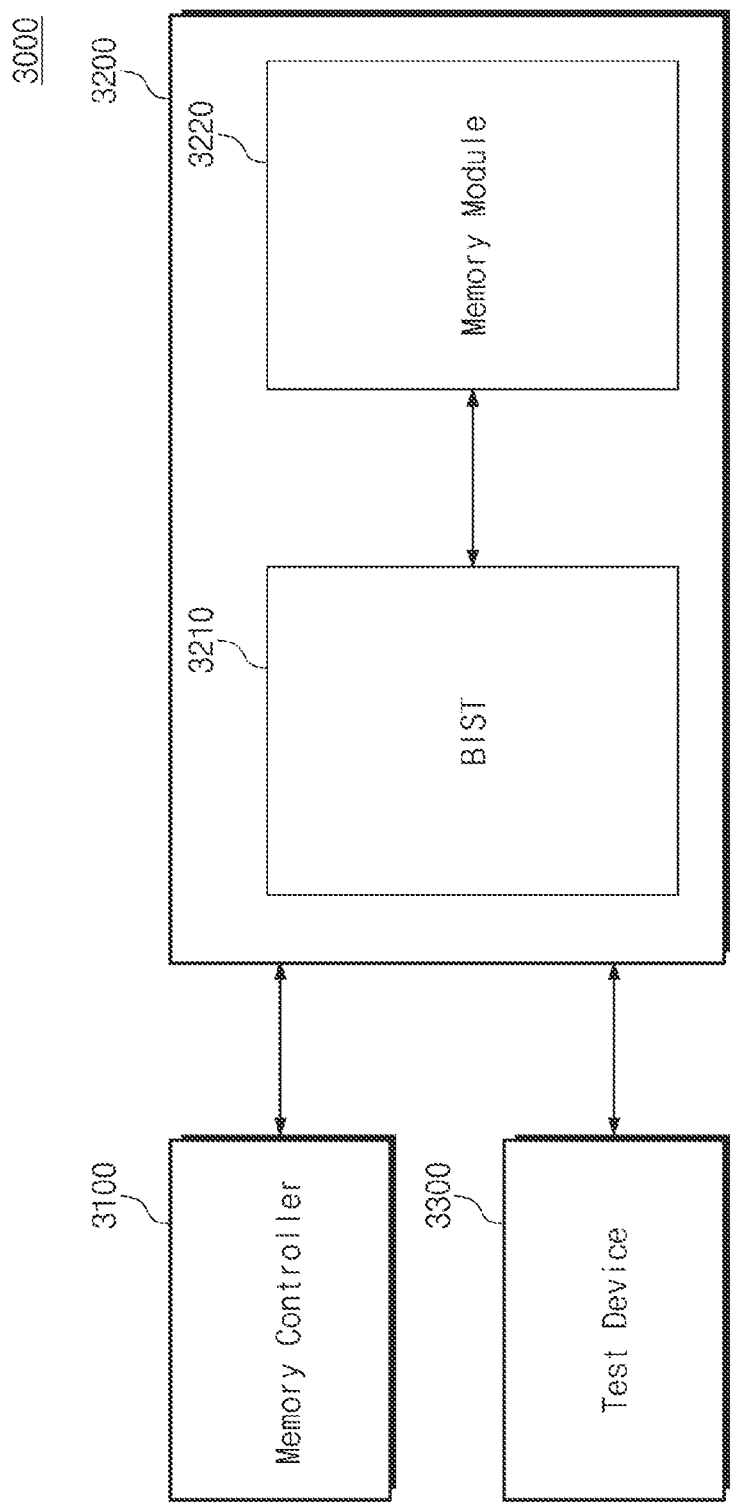

FIG. 13C is a block diagram illustrating a memory system according to an embodiment of the inventive concept. Referring to FIG. 13C, a memory system 3000 may include a memory controller 3100, a memory device 3200, and a test device 3300. The memory device 3200 may include BIST logic 3210 and a memory module 3220. The BIST logic 3210 may operate based on test methods previously described in relation to embodiments of the inventive concept.

In some embodiments, the memory controller 3100 may store data in the memory device 3200 or may read data stored in the memory device 3200. The memory device 3200 may operate under control of the memory controller 3100. The test device 3300 may be automated test equipment (ATE) that tests the memory device 3200.

Figure 13D:
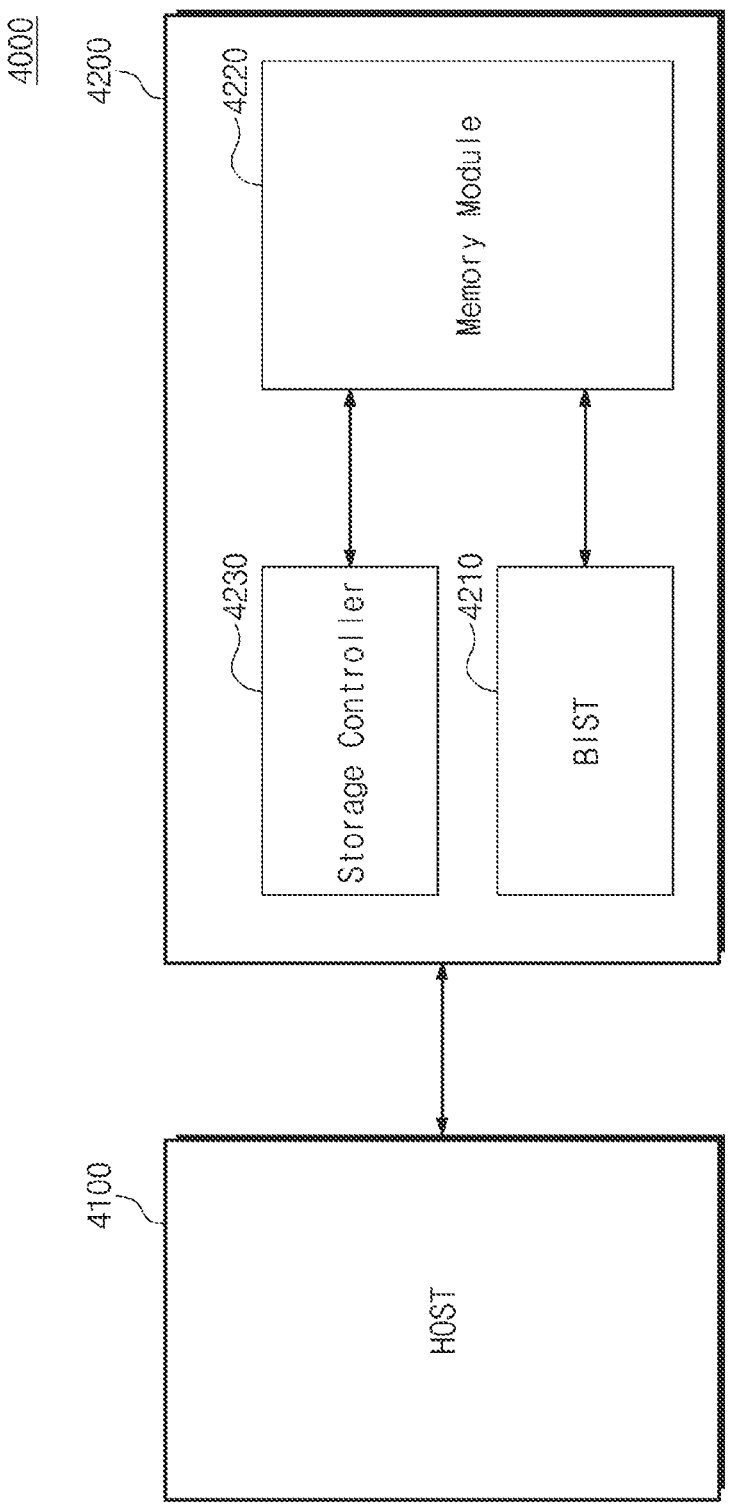

FIG. 13D is a block diagram illustrating a memory system according to an embodiment of the inventive concept. Referring to FIG. 13D, a memory system 4000 may include a host 4100 and a storage device 4200. The storage device 4200 may include BIST logic 4210, a memory module 4220, and a storage controller 4230. The BIST logic 4210 may operate based on test methods previously described in relation to embodiments of the inventive concept.

In some embodiments, the storage controller 4230 may be configured to process various requests from the host 4100. For example, depending on a request of the host 4100, the storage controller 4230 may store data in the memory module 4220 or may read data stored therein.

Figure 13E:
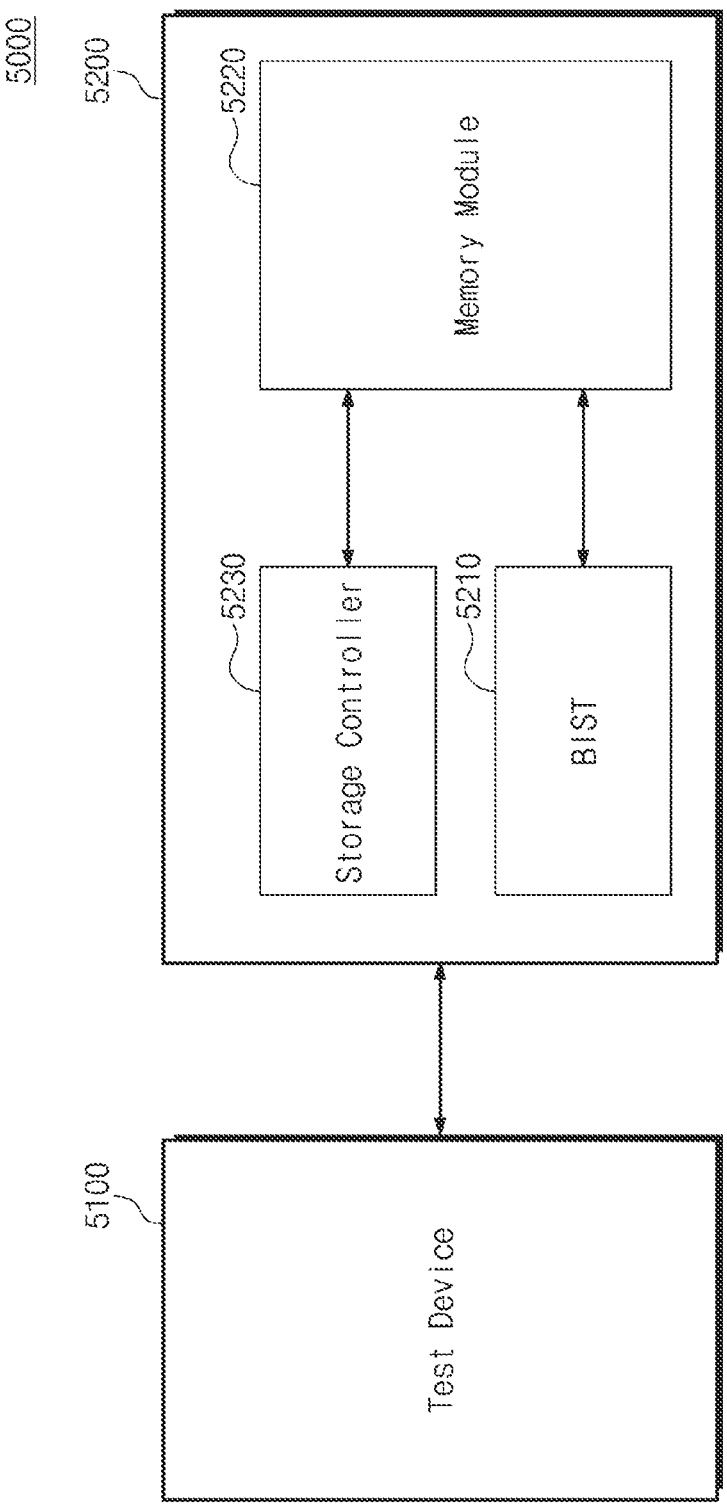

FIG. 13E is a block diagram illustrating a test system according to an embodiment of the inventive concept. Referring to FIG. 13E, a test system 5000 may include a test device 5100 and a storage device 5200. The storage device 5200 may include BIST logic 5210, a memory module 5220, and a storage controller 5230. The BIST logic 5210 may operate based on test methods previously described in relation to embodiments of the inventive concept.

Figure 13F:
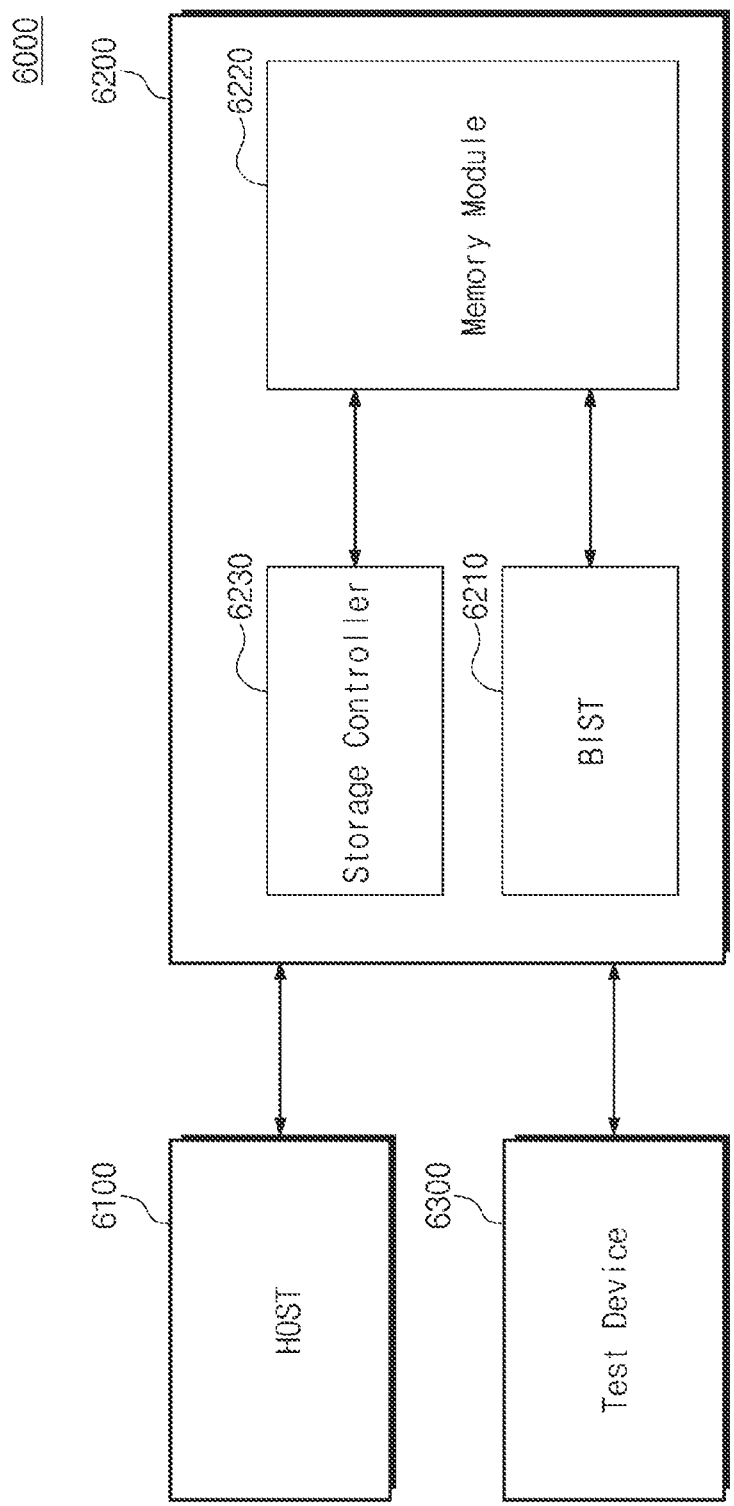

FIG. 13F is a block diagram illustrating a memory system according to an embodiment of the inventive concept. Referring to FIG. 13F, a memory system 6000 may include a host 6100, a storage device 6200, and a test device 6300. The storage device 6300 may include BIST logic 6210, a memory module 6220, and a storage controller 6230. The BIST logic 6210 may operate based on test methods previously described in relation to embodiments of the inventive concept.

As described above, the BIST logic circuit 110 according to an embodiment of the inventive concept may perform the parity substitution operation and the parity restoration operation. The number of 0s included in substituted parity data may be smaller than the number of 0s included in original parity data. As such, the BIST logic circuit 110 may improve a test coverage of the memory module 120 and may reduce a time taken to perform a test.

According to embodiments of the inventive concept, a write failure for a memory device may be detected by iteratively writing a specific pattern in the memory module. In this case, a test coverage may change with a value of parity data. Built-in-self-test logic capable of improving a test coverage by substituting for parity data, a memory device including the BIST logic, and a test method for the memory module are provided.

While the inventive concept has been described with reference to embodiments thereof, it will be apparent to those of ordinary skill in the art that various changes and modifications may be made thereto without departing from the spirit and scope of the inventive concept as set forth in the following claims.

What is claimed is:

1. A memory device comprising:
a memory module; and
a built-in self-test (BIST) logic circuit configured to perform testing on memory cells of the memory module, the BIST logic circuit including:
a pattern generator configured to generate first main data including a first portion;
an error correction code (ECC) encoder configured to generate first parity data based on the first main data; and
a parity control circuit configured to generate mask data based on the first parity data and the first main data, and generate first substituted parity data based on the mask data and the first parity data,
wherein a pattern of the first substituted parity data is the same as a pattern of the first portion of the first main data.

2. The memory device of claim 1, wherein the parity control circuit is configured to send write data including the first main data and the first substituted parity data to the memory module, receive read data including second main data and second substituted parity data from the memory module, and generate second parity data based on the second substituted parity data and the mask data, and
the BIST logic circuit includes an ECC decoder configured to correct an error in the second main data based on the second parity data.

3. The memory device of claim 2, wherein the parity control circuit includes:
a mask generating module configured to generate the mask data based on the first main data and the first parity data;
a parity substituting module configured to generate the first substituted parity data based on the mask data and the first parity data; and
a parity restoring module configured to restore the second parity data based on the mask data and the second substituted parity data.

4. The memory device of claim 3, wherein the BIST logic circuit further comprises a parity position control circuit configured to control a position of the first substituted parity data in the write data.

5. The memory device of claim 3, wherein the parity control circuit further includes:
an extract module configured to extract the first portion of the first main data based on the first main data, and send the first portion of the first main data to the mask generating module; and
an extract and attachment module configured to receive the first substituted parity data from the parity substituting module, generate the write data based on the first substituted parity data and the first main data, extract the second substituted parity data and the second main data from the read data, and provide the second substituted parity data to the parity restoring module,
wherein a number of bits of the first portion of the first main data is the same as a number of bits of the first parity data.

6. The memory device of claim 5, wherein the mask generating module includes:
a first XOR operator configured to output the mask data by performing a logical operation on the first portion of the first main data and the first parity data; and
a first register configured to store the mask data output from the first XOR operator,
wherein the parity substituting module includes a second XOR operator configured to output the first substituted parity data by performing the logical operation on the mask data provided from the mask generating module and the first parity data, and
the parity restoring module includes a third XOR operator configured to output the second parity data by performing the logical operation on the second substituted parity data and the mask data provided from the mask generating module.

7. The memory device of claim 5, wherein the extract and attachment module is configured to send a write command, an address, and the write data to the memory module, send a read command and the address to the memory module, and receive the read data based on the address.

8. The memory device of claim 2, wherein the BIST logic circuit further comprises an analysis circuit configured to receive corrected second main data and ECC status information from the ECC decoder and generate test results based on the ECC status information.

9. The memory device of claim 1, wherein the pattern generator is configured to receive a test enable signal and generate the first main data in response to the test enable signal.

10. The memory device of claim 1, wherein the ECC encoder is configured to generate the first parity data by using ECC including at least one of a low density parity check (LDPC) code, a Bose, Chaudhuri, Hocquenghem (BCH) code, a turbo code, a Reed-Solomon code, a convolution code, a recursive systematic code (RSC) and a coded modulation including one of a trellis-coded modulation (TCM) and a block coded modulation (BCM).

11. The memory device of claim 1, wherein the memory module includes:
a memory cell array including a plurality of memory cells; and
a driving circuit configured to perform a write operation and a read operation on the plurality of memory cells,
wherein each of the plurality of memory cells includes a selection transistor configured to operate in response to a voltage of a word line, wherein a first end of the selection transistor is connected with a source line, and a variable resistance element connected between a second end of the selection transistor and a bit line, wherein a resistance value of the variable resistance element varies depending on current direction.

12. A built-in self-test (BIST) logic circuit configured to perform a testing on a memory module, the BIST logic circuit comprising:
a pattern generator configured to generate first main data;
an error correction code (ECC) encoder configured to generate first parity data for the first main data;
an ECC decoder; and
a parity control circuit configured during a write operation to receive the first main data and the first parity data and generate write data, and further configured during a read operation to receive read data including second main data and second substituted parity data,
wherein the parity control circuit includes a mask generating module configured to generate mask data based on the first main data and the first parity data, a parity substituting module configured to generate first substituted parity data based on the mask data and the first parity data, and a parity restoring module configured to generate second parity data based on the mask data and the second substituted parity data,
the parity control circuit is further configured to send the write data including the first substituted parity data and the first main data to the memory module and receive the read data from the memory module, and
the ECC decoder is configured to correct an error in the second main data based on the second parity data and the second main data.

13. The test logic circuit of claim 12, wherein the parity control circuit further includes:
a first multiplexer configured to receive the first parity data, the first substituted parity data and a parity substitution enable signal, and output one of the first parity data and the first substituted parity data in response to the parity substitution enable signal; and
a second multiplexer configured to receive the second parity data, the second substituted parity data and the parity substitution enable signal, and output one of the second parity data and the second substituted parity data in response to the parity substitution enable signal.

14. The test logic circuit of claim 12, wherein the parity control circuit further includes:
an extract module configured to extract a first portion of the first main data based on the first main data, and send the first portion of the first main data to the mask generating module; and
an extract and attachment module configured to receive the first substituted parity data, generate the write data based on the first substituted parity data and the first main data, extract the second substituted parity data and the second main data from the read data, and provide the second substituted parity data to the parity restoring module,
wherein a number of bits of the first portion of the first main data is the same as a number of bits of the first parity data.

15. The test logic circuit of claim 12, wherein the mask generating module includes:
a first XOR operator configured to output the mask data by performing a logical operation on a first portion of the first main data and the first parity data; and
a first register configured to store the mask data,
wherein the parity substituting module includes a second XOR operator configured to output the first substituted parity data by performing the logical operation on the mask data and the first parity data, and
the parity restoring module includes a third XOR operator configured to output the second parity data by performing the logical operation on the second substituted parity data and the mask data.

16. The test logic circuit of claim 12, wherein the parity control circuit further includes a parity position control circuit configured to control a position of the first substituted parity data in the write data.

17. The test logic circuit of claim 12, wherein a number of 0's in the first substituted parity data is less than a number of 0's in the first parity data.

18. A method for testing a memory module including a plurality of memory cells, the method comprising:
generating first main data to be written in the plurality of memory cells;
generating first parity data for the first main data;
setting mask data based on the first parity data and the first main data;
performing a parity substitution operation generating first substituted parity data based on the first parity data and the mask data;
writing write data including the first main data and the first substituted parity data in the plurality of memory cells;
reading stored write data from the plurality of memory cells to generate read data including second main data and second substituted parity data;

performing a parity restoration operation generating second parity data from the second substituted parity data using the mask data; and correcting an error in the second main data using the second parity data, wherein a pattern of the first substituted parity data is the same as a pattern of a first portion of the first main data.

19. The method of claim 18, wherein the setting of the mask data includes:

extracting the first portion of the first main data from the first main data;

generating the mask data based on the first main data and the first parity data; and storing the mask data in a register.

20. The method of claim 18, wherein the performing of the parity restoration operation includes:

extracting the second main data and the second substituted parity data from the read data; and restoring the second parity data based on the second substituted parity data and the mask data.

* * * * *